(12) United States Patent
Xiang et al.

(10) Patent No.: US 10,290,694 B2
(45) Date of Patent: May 14, 2019

(54) ORGANIC LIGHT-EMITTING DISPLAY PANEL AND ORGANIC LIGHT-EMITTING DISPLAY DEVICE

(71) Applicant: SHANGHAI TIANMA AM-OLED CO., LTD., Shanghai (CN)

(72) Inventors: Dongxu Xiang, Shanghai (CN); Renyuan Zhu, Shanghai (CN); Yue Li, Shanghai (CN); Yana Gao, Shanghai (CN); Zhonglan Cai, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/937,880

(22) Filed: Mar. 28, 2018

(65) Prior Publication Data
US 2018/0219058 A1    Aug. 2, 2018

(30) Foreign Application Priority Data
Nov. 29, 2017    (CN) .......................... 2017 1 1228615

(51) Int. Cl.
*H01L 51/00*    (2006.01)
*H01L 27/32*    (2006.01)
*H01L 27/12*    (2006.01)

(52) U.S. Cl.
CPC ...... *H01L 27/3279* (2013.01); *H01L 27/3225* (2013.01); *H01L 27/3227* (2013.01); *H01L 27/124* (2013.01); *H01L 27/3248* (2013.01)

(58) Field of Classification Search
CPC ............. H01L 27/3279; H01L 27/3225; H01L 27/3227; H01L 27/124; H01L 24/3248
See application file for complete search history.

(56) References Cited

U.S. PATENT DOCUMENTS

2018/0294327 A1* 10/2018 Chen .................. H01L 27/3244

* cited by examiner

*Primary Examiner* — Victor A Mandala
*Assistant Examiner* — Colleen E Snow
(74) *Attorney, Agent, or Firm* — Kilpatrick Townsend & Stockton, LLP

(57) ABSTRACT

Disclosed are an organic light-emitting display panel and an organic light-emitting display device. The organic light-emitting display panel includes a display area, a middle area of the display panel, an array substrate, pixels arranged in an array, and first signal lines and second signal lines for providing the pixels with signals and extending in a first direction, in the display area of the array substrate, a first quantity of pixels corresponding to a first signal line is less than a second quantity of pixels corresponding to a second signal line, and first transparent conductive lines are electrically connected with the first signal lines in the middle area.

20 Claims, 17 Drawing Sheets

ORGANIC LIGHT-EMITTING DISPLAY PANEL AND ORGANIC LIGHT-EMITTING DISPLAY DEVICE

CROSS-REFERENCE TO RELATED APPLICATION

This application claims priority of Chinese Patent Application No. 201711228615.X, filed on Nov. 29, 2017, which is hereby incorporated by reference in its entirety.

FIELD

The present disclosure relates to the field of display technologies, and particularly to an organic light-emitting display panel and an organic light-emitting display device.

BACKGROUND

As the display screen technologies are advancing, an all-screen display panel has emerged, and has a display area with a higher duty ratio, and an ultra-narrow edge frame, thus greatly improving a visual experience of its watcher, as compared with a general display panel.

SUMMARY

In a first aspect, an embodiment of the disclosure provides an organic light-emitting display including a display area, a middle area of the display panel, an array substrate, pixels arranged in an array, and first signal lines and second signal lines for providing the pixels with signals and extending in a first direction, in the display area of the array substrate, a quantity of pixels corresponding to each of the first signal lines is less than a quantity of pixels corresponding to each of the second signal lines, and there are first transparent conductive lines, electrically connected with the first signal lines, in the middle area.

In another aspect, an embodiment of the disclosure provides an organic light-emitting display device including the organic light-emitting display panel according to any one of the embodiments of the disclosure.

DETAILED DESCRIPTION OF THE EMBODIMENTS

Figure 1:
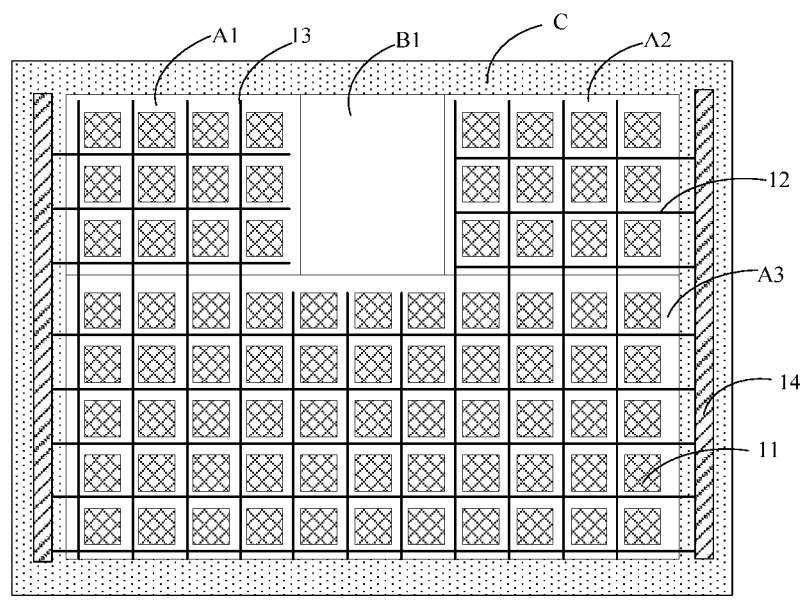
FIG. 1 is a schematic structural diagram of an organic light-emitting display panel in the related art.

Like reference numerals in the drawings represent like or similar components, so a repeated description thereof will be omitted. All the terms described in the context to represent positions and directions are presented with reference to the drawings, but may be altered as needed without departing from the scope of the disclosure as claimed. The drawings of the disclosure are merely intended to illustrate relative positional relationships, and the thickness of some component may be exaggerated as illustrated for the sake of convenient understanding, although the thickness in the drawings shall not represent any proportional relationship thereof with a real thickness.

The disclosure can be embodied in a variety of other embodiments than those described here, so the disclosure will not be limited to the particular embodiments as disclosed below Some denomination as used in the description and the claims refers to a specific component. In one embodiment, the same component may be denominated by different hardware manufacturers using different names. One component will be distinguished from another component in the description and the claims by their functional difference instead of their different names. The opening term "include" or "comprise" as referred to throughout the description and the claims may be interpreted as "include but will not be limited to". Embodiments of the disclosure will be described below in the description, but they are merely intended to illustrate a general principle of the disclosure instead of limiting the scope of the disclosure thereto. It shall be appreciated that when an element, e.g., a layer, a film, an area, or a substrate, is referred to as being "on" another element, it may be directly on another element, or there may be one or more intermediate elements between them.

FIG. 1 illustrates a structural diagram of an all-screen organic light-emitting display panel in the related art, which includes a display area, a middle area B1, and a non-display area C surrounding the display area, where the middle area B1 is a hollowed area in which neither OLED light-emitting element nor a pixel control circuit is arranged, and the display area includes a first display area A1, a second display area A2, and a third display area A3, in each of which there are OLED light-emitting elements 11 arranged in array, a plurality of gate lines 12 electrically connected with respective rows of OLED light-emitting elements, a plurality of data lines 13 electrically connected with respective columns of OLED light-emitting elements, and other signal lines. However the gate lines 12 in the first display area A1 and the second display area A2 locating on two sides of the middle area B1 are broken, so that there are different loads on the gate lines 12 in the first display area A1 from loads on the gate lines 12 in the second display area A2, and from loads on the gate lines 12 in the third display area A3, and thus there are different voltage drops on the gate lines 12 in the first display area A1, the gate lines 12 the second display area A2, and the gate lines 12 in the third display area A3; and when the display area is driving using a pixel control circuit, there is such a signal delay in the first display area A1 and the second display area A2 that an image is displayed differently in the first display area A1, the second display area A2, and the third display area A3 on the display panel, so that the image is displayed non-uniformly and even divided on the all-screen display panel, thus degrading a display effect of the display panel.

Furthermore as illustrated in FIG. 1, there are gate driver circuits 14, for driving the gate lines 12 of the display panel, in the non-display area C of the display panel, and the display panel includes two gate driver circuits 14 arranged respectively on the left and right sides thereof to scan concurrently the gate lines 12 in the display panel. However each gate 12 in the third display area A3 is driven bilaterally, and the gate lines 12 in the first display area A1 and the second display area A2 are driven unilaterally, due to the middle area B1. In addition to the different loads on the gate lines in the first display area A1 and the second display area A2, the gate lines in the first display area A1 and the second display area A2 are scanned in a unilateral driving mode, thus exacerbating the signal delay in the first display area A1 and the second display area A2, so that the image is displayed non-uniformly and even divided on the all-screen display panel, thus further degrading the display effect of the display panel.

In view of this, in order to address the problem above, the embodiments of the disclosure provide an organic light-emitting display panel and an organic light-emitting display device so as to address the problem in the related art there are so different loads on the signal lines due to the arrangement of the middle area that the image is displayed non-uniformly and even divided on the display panel, thus degrading the display effect of the display panel.

Figure 2:
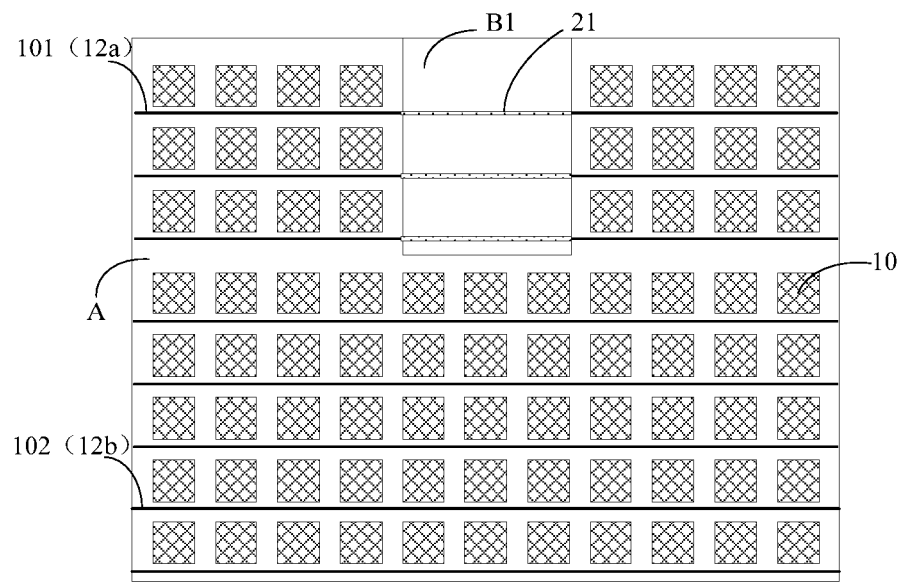
FIG. 2 and FIG. 3 are schematic structural diagrams respectively of an organic light-emitting display panel according to an embodiment of the disclosure.

In one embodiment, FIG. 2 illustrates a structural diagram of an organic light-emitting display panel according to an embodiment of the disclosure, where the organic light-emitting display panel includes a display area A and a middle area B1, and the display panel includes an array substrate, and a plurality of pixels 10 arranged in an array, and first signal lines 101 and second signal lines 102 for providing the pixels 10 with signals and extending in a first direction, in the display area A of the array substrate; the number of pixels 10 corresponding to a first signal line 101 is less than the number of pixels 10 corresponding to a second signal line 102; and there are first transparent conductive lines 21, electrically connected with the first signal lines 101, in the middle area B1.

In one embodiment, in the display panel above according to the embodiment of the disclosure, as illustrated in FIG. 2, the first direction can be the horizontal direction, that is, the first signal lines 101 can be first gate lines 12a, and the second signal lines 102 can be second gate lines 12b; and the number of pixels 10 corresponding to a first gate line 12a is less than the number of pixels 10 corresponding to a second gate line 12b, and the first gate lines 12a and the second gate lines 12b extend in the same direction. The first transparent conductive lines 21 electrically connected with the first gate lines 12a are arranged in the extension direction of the first gate lines 12a to thereby reduce the difference between the loads on the first gate lines 12a and the second gate lines 12b so as to avoid the problem of a signal delay on the first gate lines 12a and the second gate lines 12b.

Figure 3:
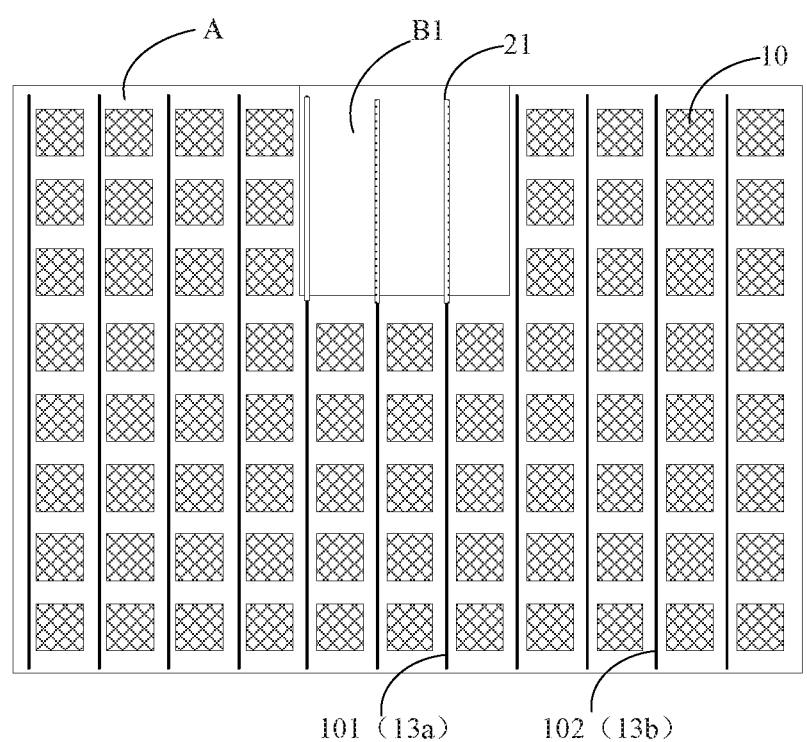

Alternatively in the display panel above according to the embodiment of the disclosure, as illustrated in FIG. 3, the first direction can be the vertical direction, that is, the first signal lines 101 can be first data lines 13a, and the second signal lines 102 can be second data lines 13b; and the number of pixels 10 corresponding to a first data line 13a is less than the number of pixels 10 corresponding to a second data line 13b, and the first data lines 13a and the second data lines 13b extend in the same direction. The first transparent conductive lines 21 electrically connected with the first data lines 13a are arranged in the extension direction of the first data lines 13a to thereby reduce the difference between the loads on the first data lines 13a and the second data lines 13b so as to avoid the problem of a signal delay on the first data lines 13a and the second data lines 13b.

In one embodiment, the first signal lines in the embodiment of the disclosure can alternatively be power source voltage signal lines, etc., instead of gate lines and data lines, although the embodiment of the disclosure will not be limited thereto.

In the display panel above according to the embodiment of the disclosure, there are the first transparent conductive lines, in the middle area, electrically connected with the first signal lines to thereby reduce the difference in load between the first signal lines and the second signal lines so as to reduce the difference between signal delays on the first signal lines and the second signal lines, so that while an image is being displayed, there are uniform signals on the first signal lines and the second signal lines, and the image is displayed uniformly on the display panel, thus avoiding the problem that the image is displayed non-uniformly and even divided on the display panel due to the different loads on the signal lines, to thereby improve a display effect of the display panel.

Figure 4A:
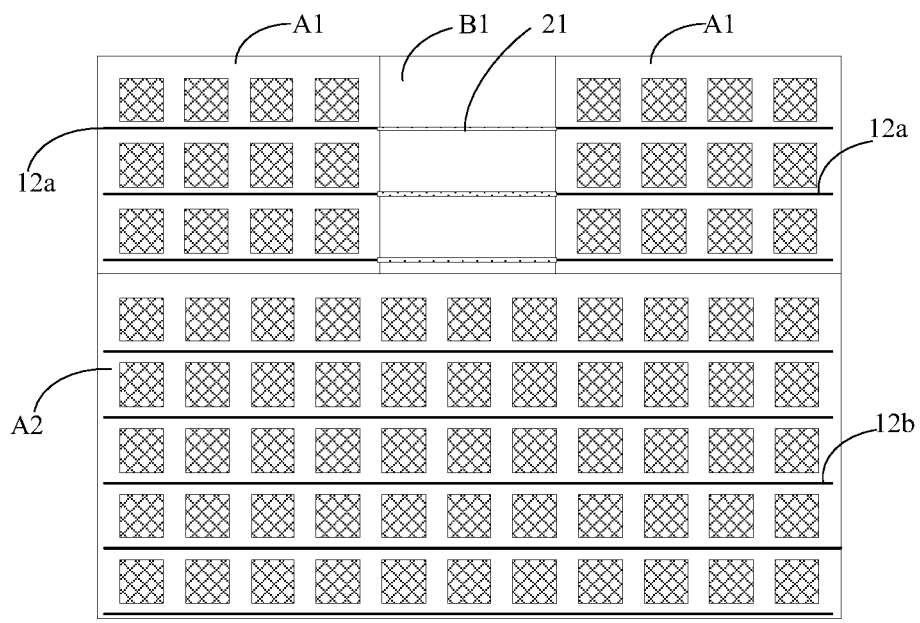
FIG. 4A and FIG. 4B are schematic structural diagrams respectively of a first transparent conductive line connected with first signal lines to two sides thereof.
Figure 4B:
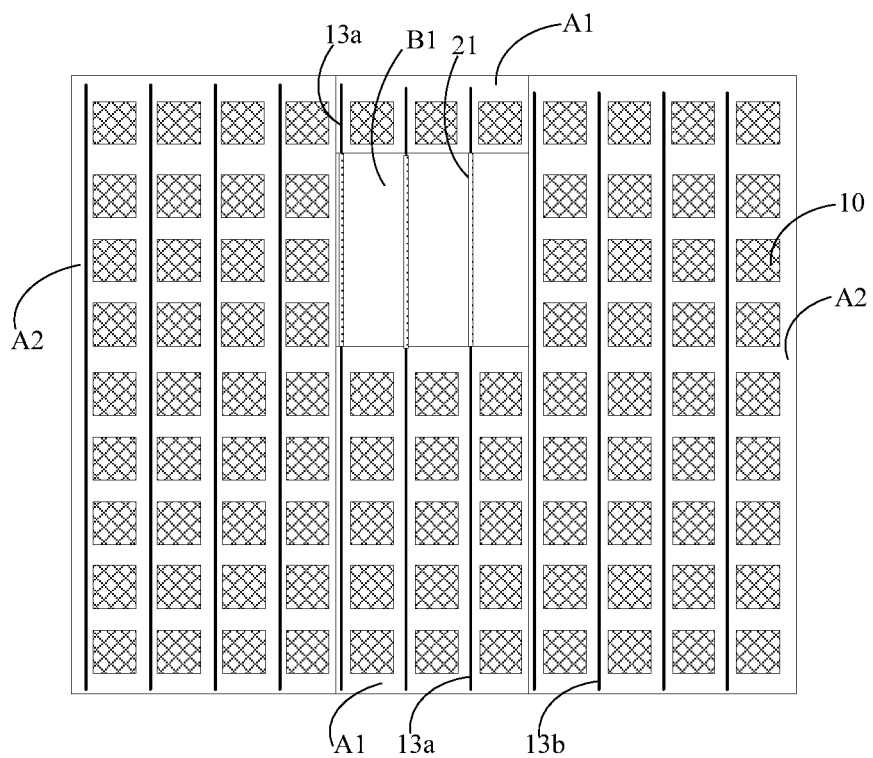

In one embodiment, in an embodiment, in the display panel above according to the embodiment of the disclosure, the first signal lines are arranged respectively to two sides of the middle area, and the first transparent conductive lines are electrically connected with the first signal lines to the two sides of the middle area. As illustrated in FIG. 4A, the first signal lines are first gate lines 12a, the second signal lines are second gate lines 12b, the first gate lines 12a are arranged respectively to two sides of the middle area B1, and the display area A includes first display areas A1 and a second display area A2, where the middle area B1 is arranged between the first display areas A1, the first gate lines 12a are located in the first display areas A1, and the second gate lines 12b are located in the second display area A2; and the number of pixels 10 corresponding to a first gate line 12a is less than the number of pixels 10 corresponding to a second gate line 12b, and there are first transparent conductive lines 21 in the middle area B1, which are electrically connected with the first gate lines 12a to the left and right sides thereof. In this way, in the embodiment of the disclosure, the first transparent conductive lines 21 are arranged in the middle area B1 to be electrically connected with the first gate lines 12a arranged to the two sides of the middle area B1, to thereby reduce the difference between loads on the first gate lines 12a in the first display area A1, and the second gate lines 12b in the second display area A2, so as to avoid the problem of a signal delay in the first display area A1 and the second display area A2 due to their different loads, thus avoiding an image from being displayed non-uniformly on the display panel, so as to improve a display effect of the display panel. Alternatively as illustrated in FIG. 4B, the first signal lines are first data lines 13a, the second signal lines are second data lines 13b, the first data lines 13a are arranged respectively to two sides of the middle area B1, the display area A includes first display areas A1 and second display areas A2, the first display areas A1 are arranged respectively to upper and lower sides of the middle area B1, the first data lines 13a are located in the first display areas AI, the second data lines 13b are located in the second display area A2, the number of pixels 10 corresponding to a first data line 13a is less than the number of pixels 10 corresponding to a second data line 13b, and there are first transparent conductive lines 21 in the middle area B1, which are electrically connected with the first data lines 13a to the upper and lower sides thereof. In this way, in the embodiment of the disclosure, the first transparent conductive lines 21 are arranged in the middle area B1 to be electrically connected with the first data lines 13a arranged to the two sides of the middle area B1, to thereby reduce the difference between loads on the first data lines 13a in the first display area A1, and the second data lines 13b in the second display area A2, so as to avoid the problem of a signal delay in the first display area A1 and the second display area A2 due to their different loads, thus avoiding an image from being displayed non-uniformly on the display panel, so as to improve a display effect of the display panel.

Figure 5A:
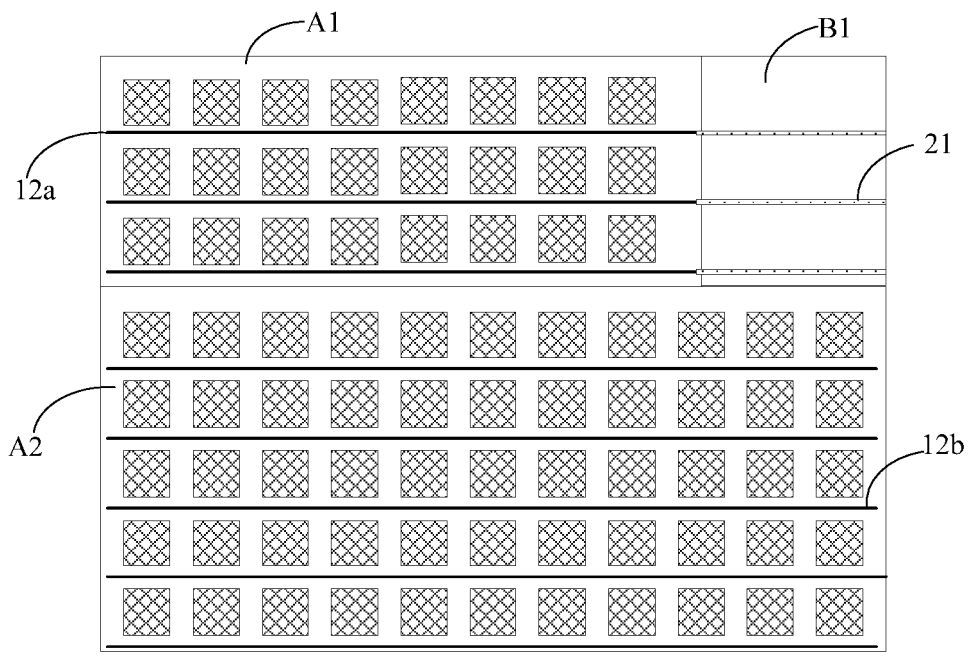
FIG. 5A and FIG. 5B are schematic structural diagrams respectively of a first transparent conductive line connected with a first signal line to a side thereof.
Figure 5B:
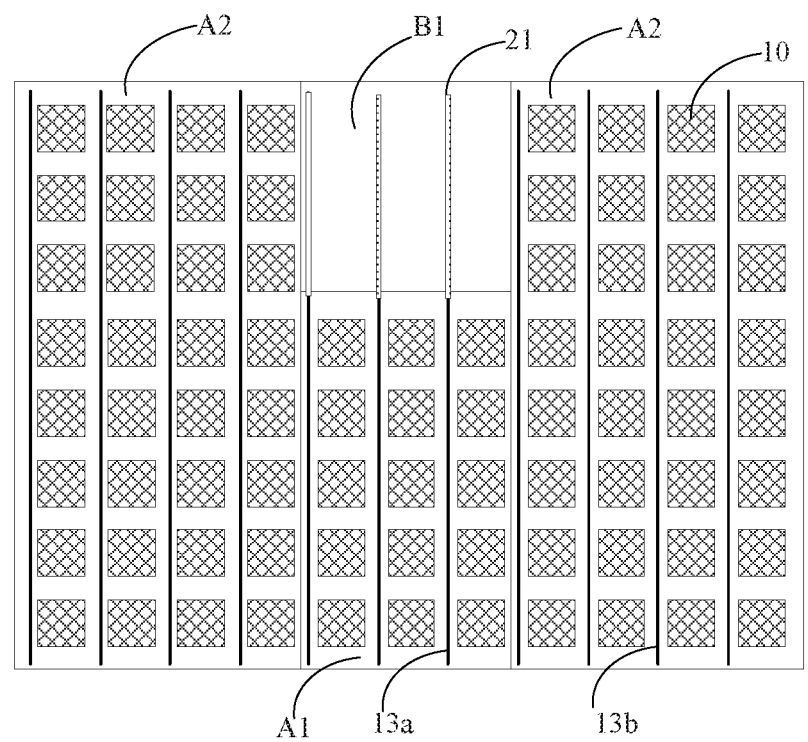

In one embodiment, in an embodiment, in the display panel above according to the embodiment of the disclosure, the first signal lines are located to only one side of the middle area, and the first transparent conductive line are electrically connected with the first signal lines to the side of the middle area. As illustrated in FIG. 5A, the first signal lines are first gate lines 12a, the second signal lines are second gate lines 12b, the first gate lines 12a are arranged to one side of the middle area B1, the display area A includes a first display area A1 and a second display area A2, the second display area A2 is arranged to the same side of the middle area B1 as the first display area A1, the first gate lines 12a are located in the first display area A1, and the second gate lines 12b are located in the second display area A2; and the number of pixels 10 corresponding to a first gate line 12a is less than the number of pixels 10 corresponding to a second gate line 12b, and there are first transparent conductive lines 21 in the middle area B1, which are electrically connected with the first gate lines 12a. In this way, in the embodiment of the disclosure, the first transparent conductive lines 21 are arranged in the middle area B1 to be electrically connected with the first gate lines 12a arranged to the side of the middle area B1, to thereby reduce the difference between loads on the first gate lines 12a in the first display area A1, and the second gate lines 12b in the second display area A2, so as to avoid the problem of a signal delay in the first display area A1 and the second display area A2 due to their different loads, thus avoiding an image from being displayed non-uniformly on the display panel, so as to improve a display effect of the display panel. Alternatively as illustrated in FIG. 5B, the first signal lines are first data lines 13a, the second signal lines are second data lines 13b, the first data lines 13a are arranged to only one side of the middle area B1, the display area A includes a first display areas A1 and second display areas A2, the second display areas A2 are arranged to the left and right sides of the middle area B1, the first data lines 13a are located in the first display area A1, the second data lines 13b are located in the second display area A2, the number of pixels 10 corresponding to a first data line 13a is less than the number of pixels 10 corresponding to a second data line 13b, and there are first transparent conductive lines 21 in the middle area B1, which are electrically connected with the first data lines 13a. In this way, in the embodiment of the disclosure, the first transparent conductive lines 21 are arranged in the middle area B1 to be electrically connected with the first data lines 13a, to thereby reduce the difference between loads on the first data lines 13a in the first display area A1, and the second data lines 13b in the second display area A2, so as to avoid the problem of a signal delay in the first display area A1 and the second display area A2 due to their different loads, thus avoiding an image from being displayed non-uniformly on the display panel, so as to improve a display effect of the display panel.

It shall be noted that the middle area can be arranged at any position on the display panel, and for example, the middle area is located at the middle of the display area of the display panel, or the middle area is arranged at the edge of the display area, although the embodiment of the disclosure will not be limited thereto.

Figure 6:
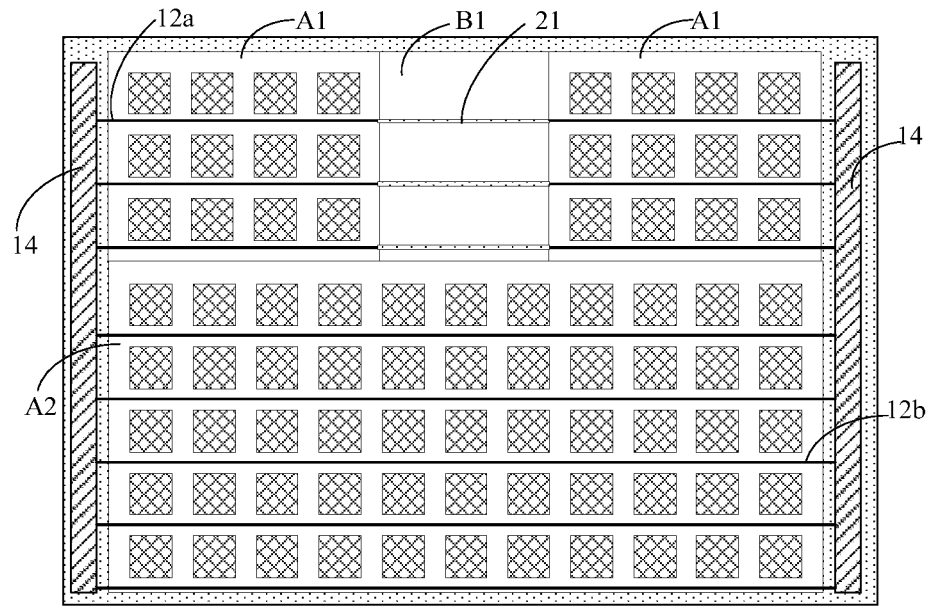
FIG. 6 is a schematic structural diagram of a second organic light-emitting display panel according to an embodiment of the disclosure.

Furthermore the first transparent conductive lines 21 in the middle area B1 are electrically connected with the first gate lines 12a so that both the gate lines in the first display area A1, and the gate lines in the second display area A2 are driven bilaterally. Referring to FIG. 6, the organic light-emitting display panel according to the embodiment of the disclosure further includes gate driver circuits 14, in the non-display area C, for providing scan signals to the first gate lines 12a and the second gate lines 12b, and in order to enable the gate lines in the first display area A1 and the second display area A2 to receive scan signals, the display panel includes gate driver circuits 14, on the left and right sides of the non-display area C, for providing scan signals to the first gate lines 12a and the second gate lines 12b respectively. Since the first transparent conductive lines 21 are arranged in the middle area B2, the first gate lines 12a, in the first display area A1, for scanning the respective rows of pixels are electrically connected with the first transparent conductive lines 21, so that the connected first gate lines 12a receive scan signals at both of their ends, that is, the first display area A1 is driven bilaterally instead of being driven unilaterally, so both the first display area A1 and the second display area A2 on the display panel are driven bilaterally to thereby improve the efficiency of scanning the gate lines in the first display area A1 and the second display area A2 so as to avoid the problem of a signal delay in the first display area A1 and the second display area. A2, thus improving a display effect of the display panel.

It shall be noted that the first transparent conductive lines 21 in the middle area B1 according to the embodiment of the disclosure are made of a transparent electrically-conductive material so as not to affect normal operation in the middle area B1.

In one embodiment, in the display panel above according to the embodiment of the disclosure, the first transparent conductive lines are electrically connected with the first signal lines through through-holes or the first transparent conductive lines are electrically connected directly with the first signal lines.

In order to further describe how to connect the first transparent conductive lines with the first signal lines in the embodiment of the disclosure, this will be illustrated below in a particular structural diagram thereof.

Generally, in order to display normally on the organic light-emitting display panel, there are a plurality of OLED light-emitting elements arranged in an array in the display area, and in order to control the OLED light-emitting elements to emit light normally, the display panel further includes a pixel control circuit configured to drive the OLED light-emitting elements to emit light, where the pixel control circuit includes a plurality of thin film transistors, e.g., switch transistors and driver transistors. In one embodiment, drains of the driver transistors are electrically connected with anodes of the OLED light-emitting elements through through-holes to provide the anodes with voltage so as to inject holes, and also voltage is applied to cathodes of the OLED light-emitting elements to thereby inject electrons, so that the holes and the electrons are recombined at light-emitting layers to excite the light-emitting layers to emit light, and thus a display function is enabled. Here gates of the switch transistors are electrically connected with the gate lines, and the sources of the switch transistors are electrically connected with the data lines; and when there is a valid scan signal on a gate line, a corresponding switch transistor is switched on to provide an electric signal on a corresponding data line to a corresponding driver transistor to thereby switch on the driver transistor, and to provide an electric signal on a corresponding power source voltage signal line to a corresponding OLED light-emitting element, so a display function is enabled. Accordingly in the embodiment of the disclosure, each pixel includes one of the OLED light-emitting elements.

When the first signal lines are first gate lines, and the second signal lines are second gate lines, the first transparent conductive lines will be connected with the first gate lines as described below together with a structure of the first transparent conductive lines in an one embodiment thereof.

Figure 7A:
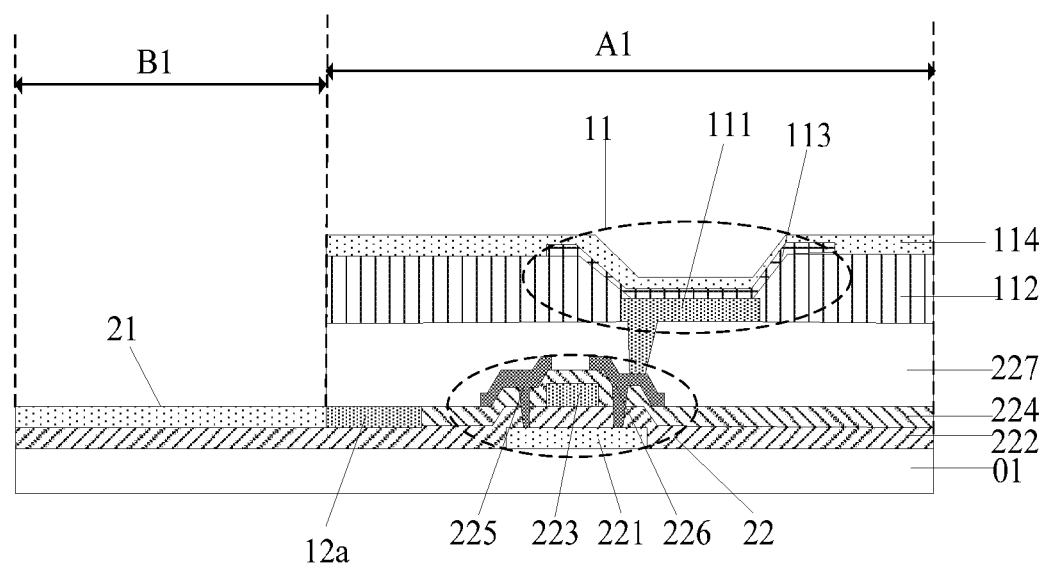
FIG. 7A, FIG. 7B, and FIG. 7C are schematic structural diagrams respectively of an organic light-emitting display panel according to an embodiment of the disclosure, where signal lines are gate lines.
Figure 7B:
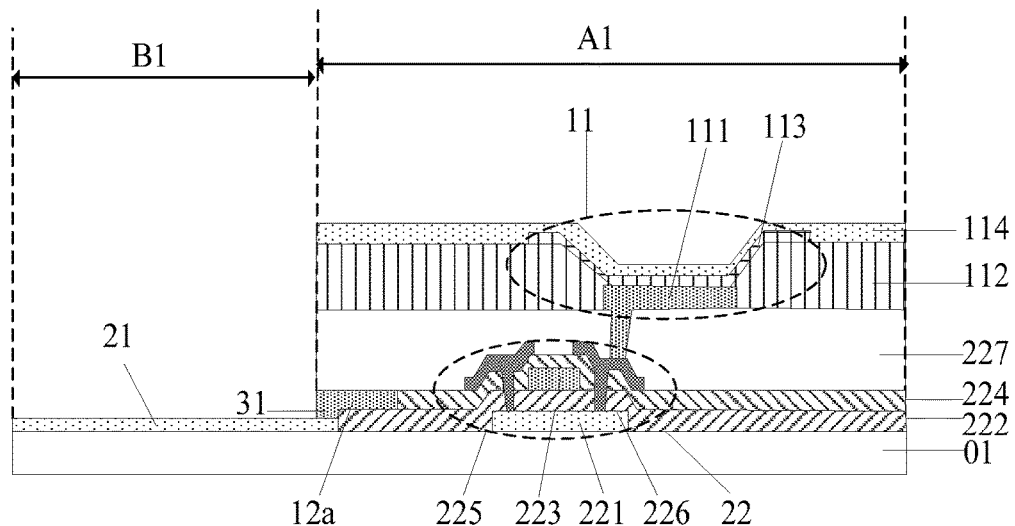
Figure 7C:
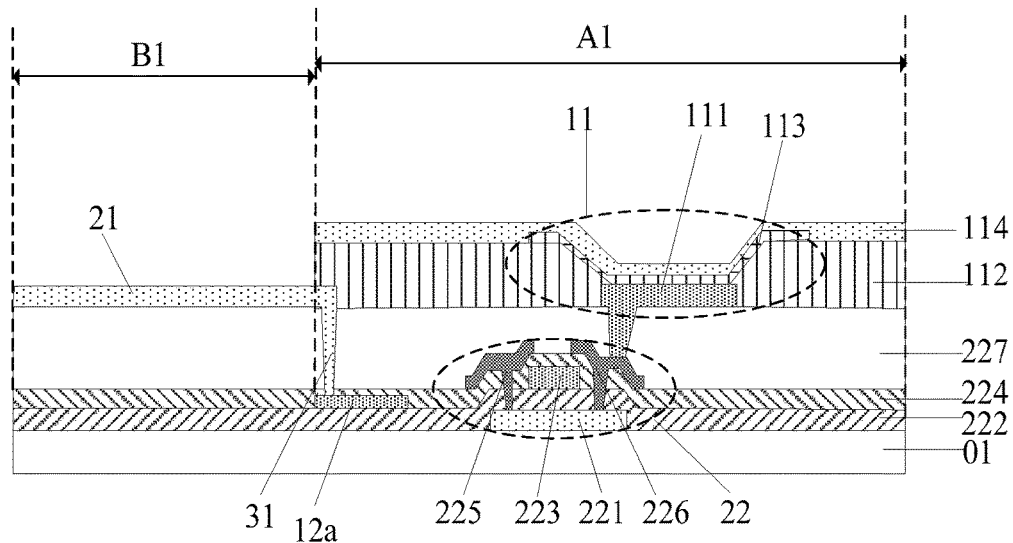

Referring to FIG. 7A, FIG. 7B, or FIG. 7C, the organic light-emitting display panel includes thin film transistors 22 arranged in sequence on an underlying substrate 01, and each thin film transistor 22 includes in the direction away from an upper surface of the underlying substrate 01: a semiconductor active layer 221 including a source area and a drain area formed by doping with N-type impurity ions or P-type impurity ions, and a channel area, which is not doped with any purity, between the source area and the drain area; and a gate insulation layer 222, a gate 223, an interlayer insulation layer 224, a source 225, and a drain 226, above the semiconductor active layer 221, where the source 225 and the drain 226 are electrically connected with the source area and the drain area in the semiconductor active layer 221 through contact holes respectively at the interlayer insulation layer 224 and the gate insulation layer 222. Each OLED light-emitting element 11 includes in the direction away from the underlying substrate 01: an anode 111, a pixel definition layer 112, a light-emitting layer 113, and a cathode 114 in that order, where the anode 111 is electrically connected with a source or a drain (the anode 111 is electrically connected with a drain 226 in FIG. 7A), and the display panel further includes a passivation layer 227 arranged between the drain 226 and the anode 111. In one embodiment, the display panel further includes a gate line electrically connected with the thin film transistor (a first gate line 12a in FIG. 7A), where the first gate line 12a is electrically connected with a metal layer of the gate 223 of the thin film transistor.

In the embodiment of the disclosure, when the first transparent conductive lines 21 are electrically connected with the first gate lines 12a arranged to one side of the middle area B1, or electrically connected with the first gate lines 12 arranged to two sides of the middle area B1, in order to further improve the stability of connecting the first transparent conductive lines 21 with the first gate lines 12a, the first gate lines 12a can be electrically connected directly with the first transparent conductive lines 21; and as illustrated in FIG. 7A, there are first transparent conductive lines 21 in the middle area B1, and there are thin film transistors 22, and OLED light-emitting elements 11 electrically connected with the thin film transistors 22, in the display area (only the first display area A1 is illustrated), where the first gate lines 12a are electrically connected directly with the first transparent conductive lines 21. Here when the gate insulation layers 222 are formed in the first display area A1, the gate insulation layers 222 overlie the middle area B1, and the first transparent conductive lines 21 are arranged above the gate insulation layers 222, so that a layer including the first transparent conductive lines 21 is at the same level as a layer including the first gate lines 12a, so the first transparent conductive lines 21 can be connected directly with the first gate lines 12a. For example, the first transparent conductive lines 21 are formed after the first gate lines 12a are formed; or the first transparent conductive lines 21 and then the first gate lines 12a are formed after the gate insulation layers 222 are formed.

Alternatively in the embodiment of the disclosure, the first transparent conductive lines 21 are electrically connected with the first gate lines 12a through through-holes. As illustrated in FIG. 7B, the first transparent conductive lines 21 are arranged directly in the middle area B1 of the underlying substrate 01, the gate insulation layers 222 are formed in the first display area A1, and only overlie the first display area A1, and there are only the first transparent conductive lines 21 in the middle area B1; and when the first gate lines 12a are formed in the first display area A1, there are also the gate insulation layers 222 between the first gate lines 12a and the first transparent conductive lines 21, so first through-holes 31 running through the gate insulation layers 222 are formed before the first gate lines 12a are formed, and the first gate lines 12a are formed so that the first gate lines 12a are electrically connected with the first transparent conductive lines 21 through the first through-holes 31.

Alternatively in order to further simplify a process of fabricating the first transparent conductive lines 21, the first transparent conductive lines 21 are arranged at the same layer, at the same time, as the anodes 111 of the OLED light-emitting elements 11 in the embodiment of the disclosure to thereby save the steps and the time for fabricating the first transparent conductive lines 21 separately. As illustrated in FIG. 7C, when the gate insulation layers 222, the interlayer insulation layers 224, and the passivation layers 227, through which light can be transmitted, are formed in the first display area A1, the gate insulation layers 222, the interlayer insulation layers 224, and the passivation layers 227 can overlie the middle area B1, and the anodes 111 are formed so that the first transparent conductive lines 21 overlying the passivation layers 227 are formed in the middle area B1, where the first transparent conductive lines 21 are made of the same material as the anodes 111, which is a transparent electrically-conductive material. Here the first transparent conductive lines 21 are electrically connected with the second gate lines 12b through the first through-holes 31 running through the passivation layers 227 and the interlayer insulation layers 224. Here the embodiment of the disclosure will not be limited to any particular layer arranged between the first transparent conductive lines 21 and the underlying substrate 01 in the middle area B1, but only one layer may be arranged, or the same layer, through which light can be transmitted, as the display area may be arranged.

In one embodiment, in the display panel above according to the embodiment of the disclosure, when the first transparent conductive lines 21 are electrically connected with the first gate lines 12a through through-holes, the through-holes are arranged in the display area. When the first transparent conductive lines are electrically connected with the first gate lines 12a through the first through-holes 31, for example, in order to avoid the middle area B1 from being affected by the arranged first through-holes, and a gate metal material filled in the first through-holes, the first through-holes 31 are arranged in a non-opening area of the first display area A1, so that those segments of the first transparent conductive lines 21, which are connected with the first gate lines 12a are arranged in the display area. Furthermore although the thin film transistor structured with a top gate has been illustrated in the embodiment of the disclosure, but the thin film transistor will not be limited thereto, but may alternatively be a thin film transistor structured with a bottom gate, and there may be also other transparent films, for the different types of thin film transistors, in the middle area B1. FIG. 7A, FIG. 7B, and FIG. 7C above merely illustrate the thin film transistor structured with a top gate, but the thin film transistor will not be limited to the structure illustrated in FIG. 7A, FIG. 7B, and FIG. 7C; and for example, there may be also another layer in the middle area B1, so that the first transparent conductive lines 21 can be positioned above or below the other film layer.

Figure 8:
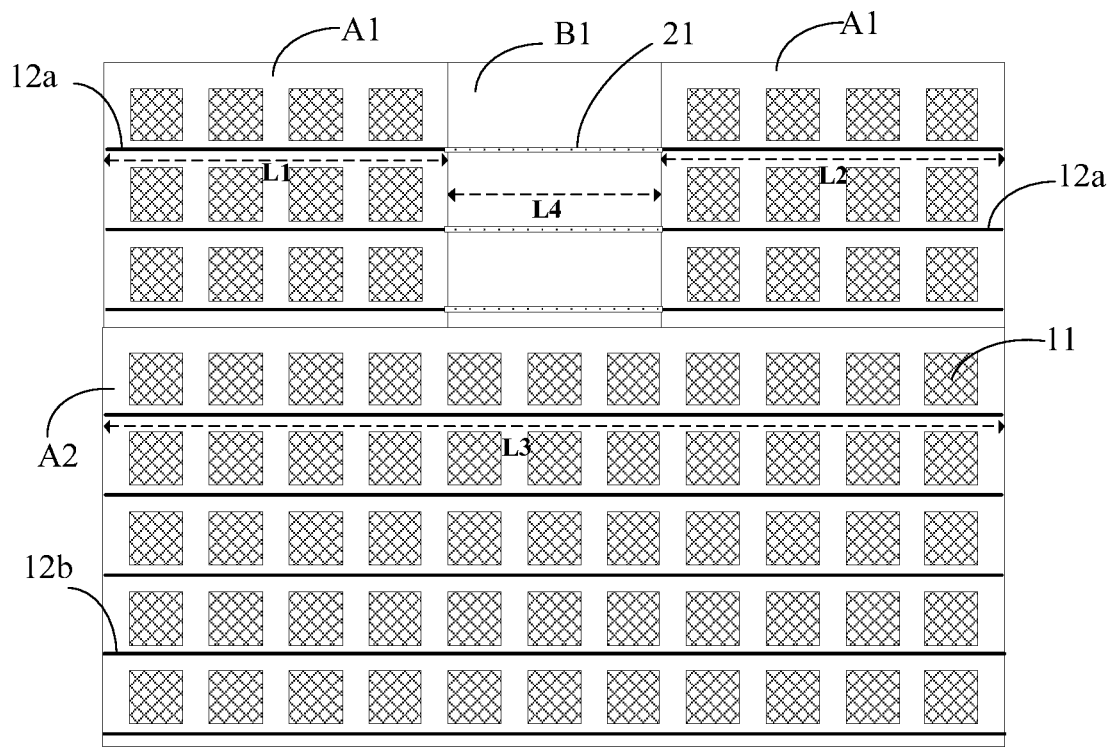
FIG. 8 is a schematic structural diagram of a length relationship between a first transparent conductive line, a first gate line, and a second gate line according to an embodiment of the disclosure.

In one embodiment, in the display panel above according to the embodiment of the disclosure, as illustrated in FIG. 8, the wiring length of a second gate line 12b in the second display area A2 is larger than the wiring length of a first gate line 12a, so there are a larger number of OLED light-emitting elements 11 or pixel circuits connected on the second gate line 12b, and thus there is a higher load on the second gate line 12b; and for example, while an image is being displayed on the display panel, there are a larger wiring length of the second gate line 12b, and a higher load thereon, so the OLED light-emitting elements 11 connected on the second gate line 12b are driven for a larger length of time, and there are a smaller wiring length of the first gate line 12a in the first display area A1, and a lower load thereon, so the OLED light-emitting elements 11 connected on the first gate line 12a are driven for a smaller length of time, so that the image being displayed is divided on the screen. Accordingly in the embodiment of the disclosure, after the first transparent conductive lines 21 are arranged in the middle area B1, the first transparent conductive lines 21 are connected with the first gate lines 12a, so that the sum of the lengths of a first gate line 12a and a first transparent conductive line 21, which are connected with each other is equal to the length of a second gate line 12b, thus further alleviating the problem of a signal delay due to the difference in routing length. Here the first gate lines 12a to the left side of the middle area B1 have a length L1 in the row direction, the first gate lines 12a to the right side of the middle area B1 have a length L2 in the row direction, the second gate lines 12b have a length L3 in the row direction, and the first transparent conductive lines 21 have a length L4 in the row direction, so L1, L2, L3, and L4 satisfy the equation of "L1+L2+L4=L3", so that the first gate lines 12a connected with the first transparent conductive lines 21 have the same length in the row direction as the length of the second gate lines 12b in the row direction, thus avoiding the problem of a signal delay due to the difference in wiring length to thereby improve a display effect of the display panel.

In one embodiment, while an image is being displayed, after the first transparent conductive lines 21 are connected with the first gate lines 12a, the number of OLED light-emitting elements to be driven by each second gate line 12b is apparently greater than the number of OLED light-emitting elements to be driven by each first gate line 12a as illustrated in FIG. 8. Accordingly there is a higher load on the second gate line 12b than a load on the first gate line 12a, thus delaying a signal on the second gate line 12b. In the embodiment of the disclosure, in order to enable loads on the first gate lines 12a electrically connected with the first transparent conductive lines 21 to be the same as loads on the second gate lines 12b, resistances of the first transparent conductive lines 21 can be changed to thereby alleviate the problem of a signal delay. For example, the line widths of the first transparent conductive lines 21 are changed to thereby change the resistances of the first transparent conductive lines 21; or the routing lengths of the first transparent conductive lines 21 are changed to thereby change a length of time for which a signal is transmitted; or the material of the first transparent conductive lines 21 is changed to thereby change the resistances of the first transparent conductive lines 21.

Figure 9A:
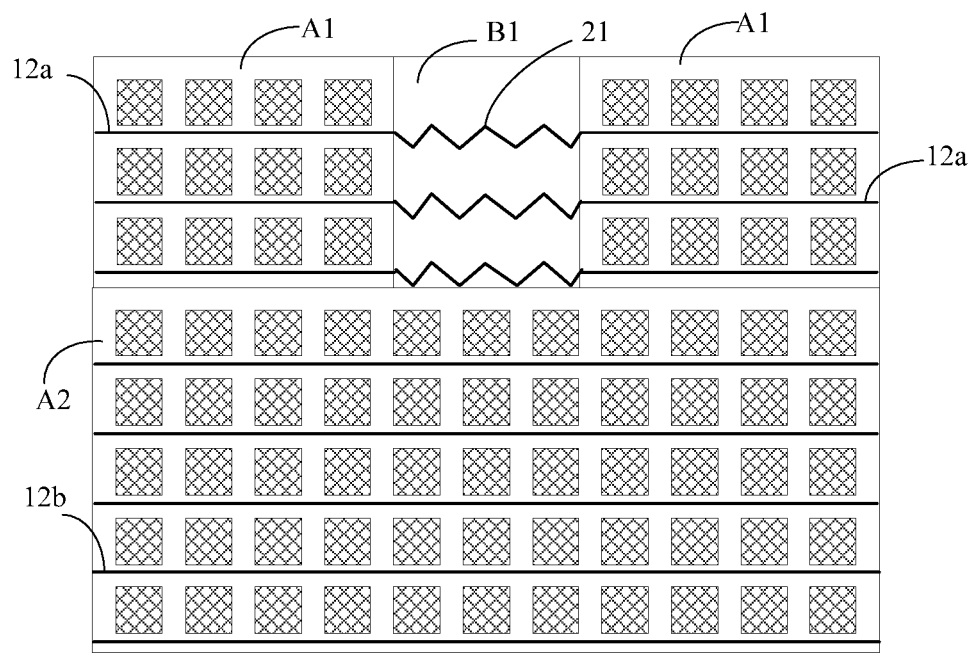
FIG. 9A, FIG. 9B, and FIG. 9C are schematic structural diagrams respectively of the shape of a first transparent conductive line according to an embodiment of the disclosure.
Figure 9B:
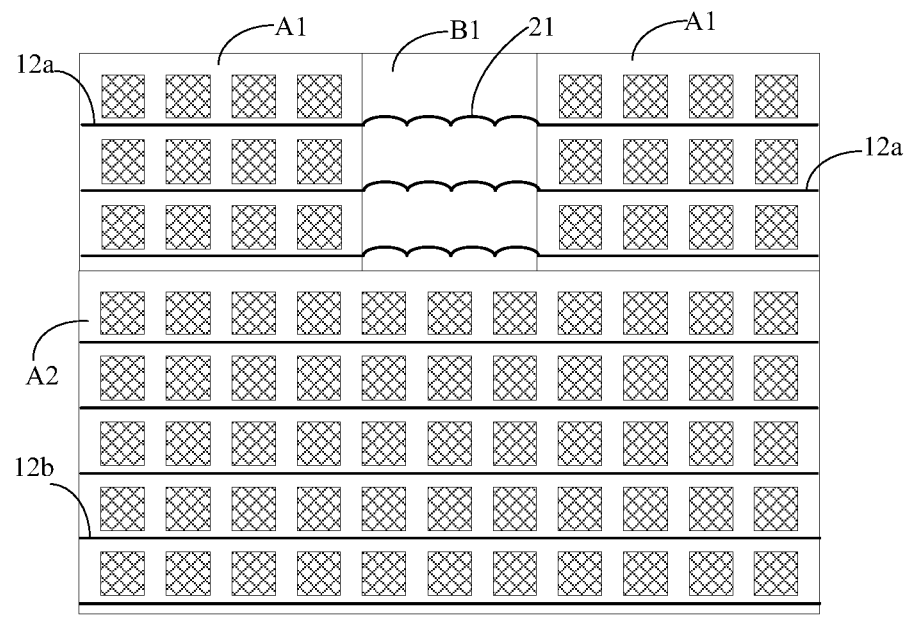
Figure 9C:
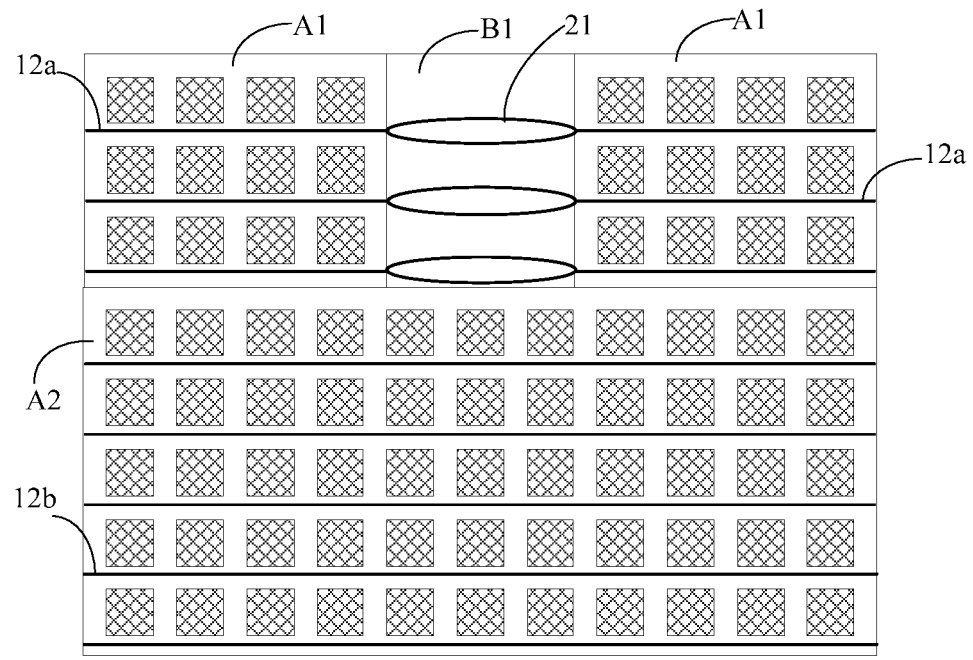

In one embodiment, the routing lengths of the first transparent conductive lines 21 are increased, and as illustrated in FIG. 9A, the first transparent conductive lines 21 are made in a zigzag shape to thereby increase the resistances of the first transparent conductive lines 21 so that there are the same loads on the first gate lines 12a electrically connected with the first transparent conductive lines 21 as loads on the second gate lines 12b, so there is the same signal delay, and thus a signal is transmitted in the same way, and there is the same image in the first display area A1 and the second display area A2, thus further improving a display effect of the display panel; or as illustrated in FIG. 9B, the first transparent conductive lines 21 are made in a wave shape; or as illustrated in FIG. 9C, the first transparent conductive lines 21 are made in an annular shape, where the first transparent conductive lines 21 are made in an annular shape, so that each first transparent conductive line 21 is electrically connected in two branches with the first gate lines 12a to thereby avoid a failure due to the first transparent conductive line 21 being broken, and further increase the resistance of the first transparent conductive line 21.

Figure 10:
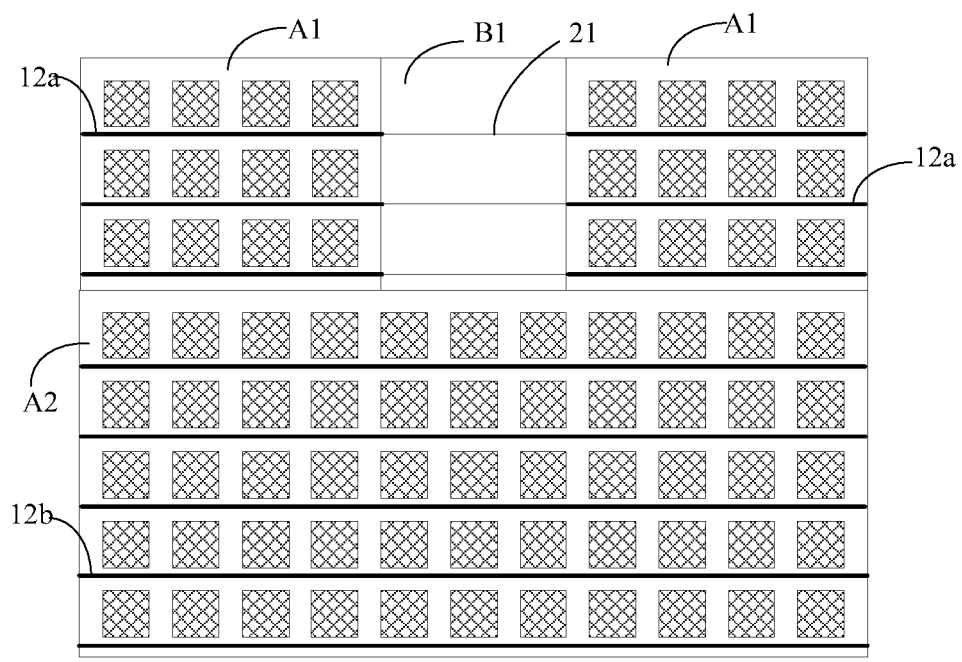
FIG. 10 is a schematic structural diagram of the line width of a first transparent conductive line according to an embodiment of the disclosure.

In one embodiment, the routing widths of the first transparent conductive lines are changed to thereby increase the resistances of the first transparent conductive lines. As illustrated in FIG. 10, the line widths of the first transparent conductive lines 21 are less than the line widths of the first gate lines 12a. In one embodiment, in the embodiment of the disclosure, a line width refers to a routing width, and there are the same line widths of the first gate lines 12a as those of the second gate lines 12b. Accordingly the routing widths of the first transparent conductive lines 21 are reduced to thereby increase the resistances of the first transparent conductive lines 21, so that there are the same loads on the first gate lines 12a electrically connected with the first transparent conductive lines 21 as loads on the second gate lines 12b, so there is the same signal delay, and thus there is the same image in the first display area A1 and the second display area A2, thus further improving a display effect of the display panel.

Figure 11:
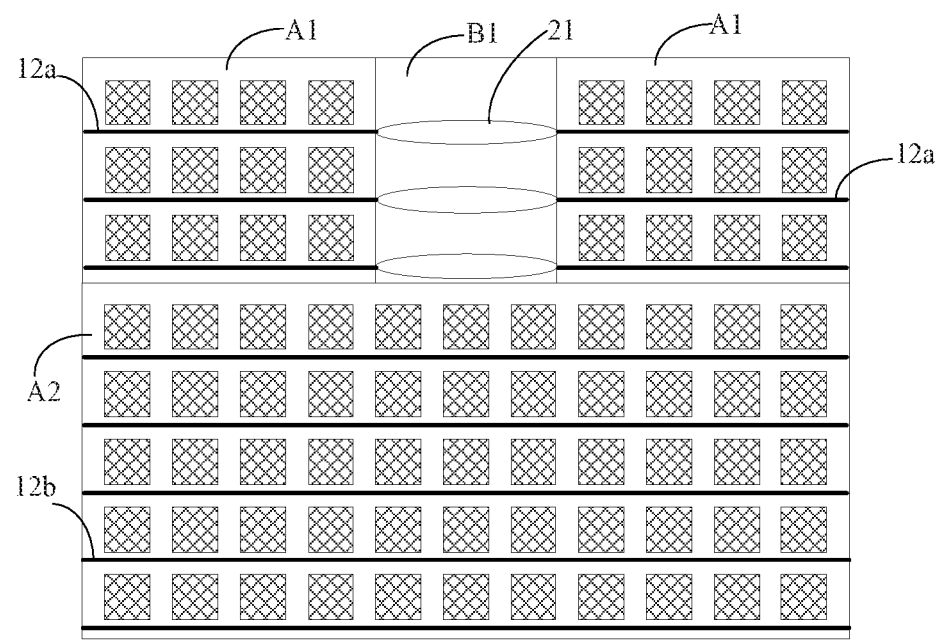
FIG. 11 is a schematic structural diagram of the line width and the shape of a first transparent conductive line according to an embodiment of the disclosure.

Furthermore in order to enable loads on the second gate lines 12b to be the same as loads on the electrically connected first gate lines 12a, the lengths of the first transparent conductive lines 21 can be further increased while the line widths of the first transparent conductive lines 21 are reduced, and for example, the first transparent conductive lines 21 are arranged in an annular shape, and the line widths of the first transparent conductive lines 21 are less than the line widths of the first gate lines 12a, as illustrated in FIG. 11.

In one embodiment, in the embodiment of the disclosure, the first transparent conductive lines can be formed by designing the resistances of the first transparent conductive lines according to a length of time for which a signal is transmitted on the second gate lines 12b while an image is being displayed really on the display panel, so that a length of time, for which a signal is transmitted while the image is being displayed after the first transparent conductive lines are electrically connected with the first gate lines 12a, is the same as the length of time for which a signal is transmitted on the second gate lines 12b while the image is being displayed, to thereby avoid the image from being displayed poorly and even divided on the screen due to a signal delay.

When the first signal lines are first data lines, and the second signal lines are second data lines, how to connect the first transparent conductive lines with the first data lines and the structure of the first transparent conductive lines, in the embodiment of the disclosure, will be described below with reference to the drawings.

It shall be noted that in the technical solution of the disclosure addressing the different loads on the data lines due to the arrangement of the middle area B1, the first display area and the second display area merely refer to different positions in the display area, but will not be limited to the first display area and the second display area in the technical solution for the gate lines according to the embodiment above, so the first display area and the second display area throughout the description merely refer to different positions in the display area, but will not suggest any specific display areas.

Figure 12A:
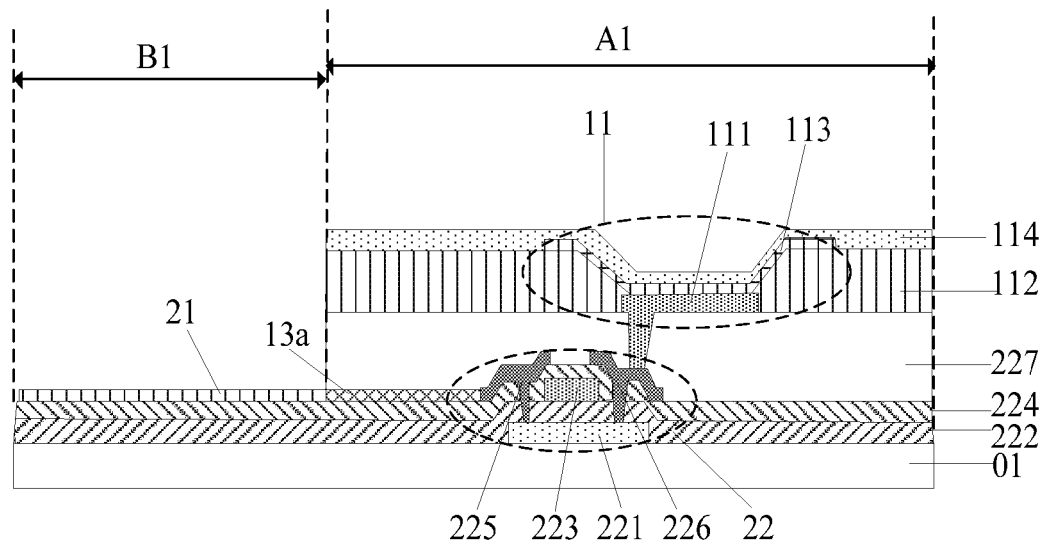
FIG. 12A, FIG. 12B, and FIG. 12C are schematic structural diagrams respectively of an organic light-emitting display panel according to an embodiment of the disclosure, where signal lines are data lines.
Figure 12B:
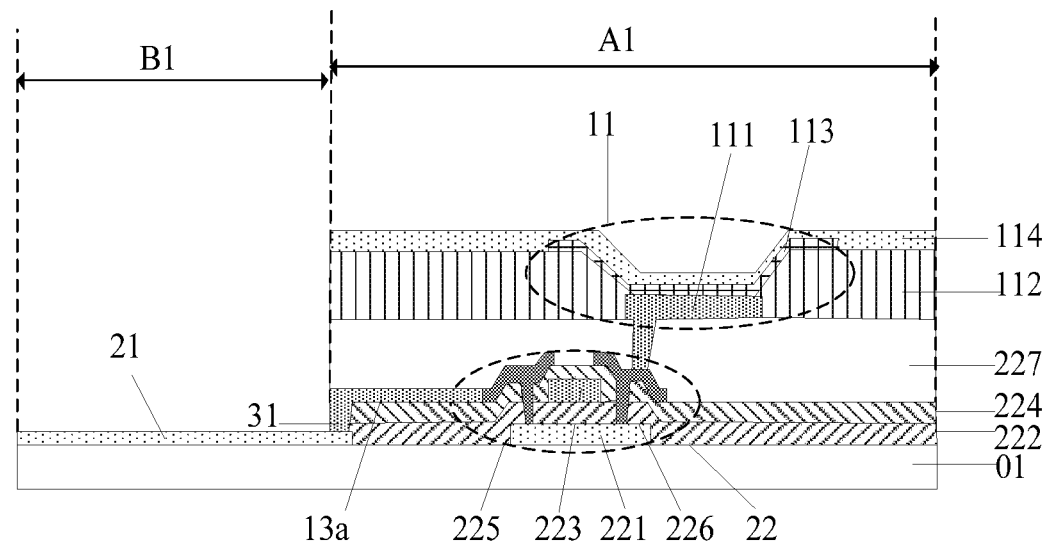
Figure 12C:
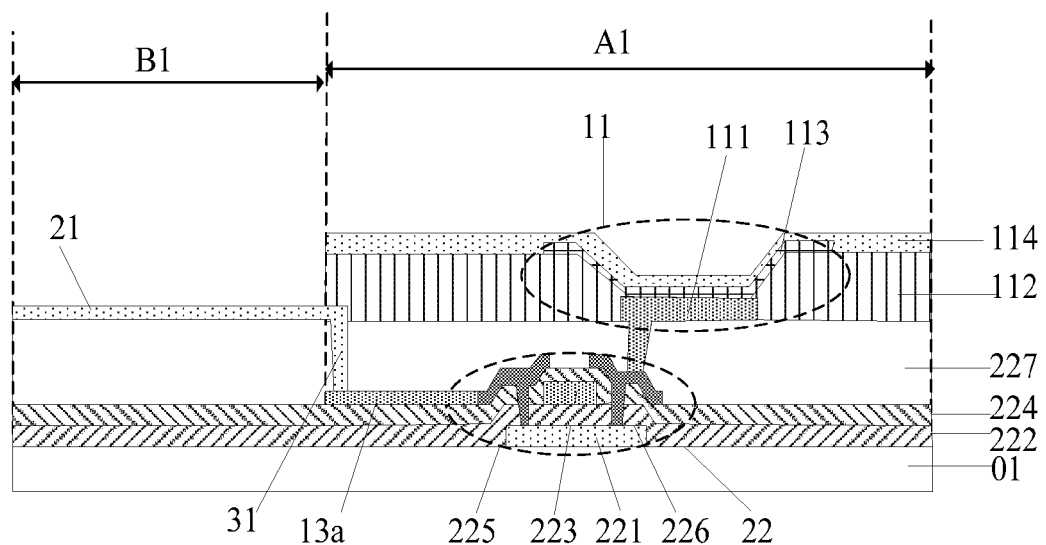

In one embodiment, referring to FIG. 12A, FIG. 12B, or FIG. 12C, the organic light-emitting display panel includes thin film transistors 22 arranged in sequence on an underlying substrate 01, and each thin film transistor 22 includes in the direction away from an upper surface of the underlying substrate 01: a semiconductor active layer 221 including a source area and a drain area formed by doping with N-type impurity ions or P-type impurity ions, and a channel area, which is not doped with any purity, between the source area and the drain area; and a gate insulation layer 222, a gate 223, an interlayer insulation layer 224, a source 225, and a drain 226, above the semiconductor active layer 221, where the source 225 and the drain 226 are electrically connected with the source area and the drain area in the semiconductor active layer 221 through contact holes respectively at the interlayer insulation layer 224 and the gate insulation layer 222. Each OLED light-emitting element 11 includes in the direction away from the underlying substrate 01: an anode 111, a pixel definition layer 112, a light-emitting layer 113, and a cathode 114 in that order, where the anode 111 is electrically connected with a source or a drain (the anode 111 is electrically connected with a drain 226 in FIG. 12A), and the display panel further includes a passivation layer 227 arranged between the drain 226 and the anode 111. In one embodiment, the display panel further includes a data line electrically connected with the thin film transistor (a first data line 13a in FIG. 12A), where the first data line 13a is electrically connected with a metal layer of the source 225 of the thin film transistor.

In the embodiment of the disclosure, when the first transparent conductive lines 21 are electrically connected with the first data lines 13a, in order to further improve the stability of connecting the first transparent conductive lines 21 with the first data lines 13a, the first data lines 13a can be electrically connected directly with the first transparent conductive lines 21; and as illustrated in FIG. 12A, there are first transparent conductive lines 21 in the middle area B1, and there are thin film transistors 22, and OLED light-emitting elements 11 electrically connected with the thin film transistors 22, in the display area (only the first display area A1 is illustrated), where the first data lines 13a are electrically connected directly with the first transparent conductive lines 21. Here when the gate insulation layers 222 are formed in the first display area A1, the gate insulation layers 222 overlie the middle area B1, and when the interlayer medium layers 224 are formed in the first display area A1, the interlayer medium layers 224 overlie the middle area B1, and the first transparent conductive lines 21 are arranged above the interlayer medium layers 224, so that a layer including the first transparent conductive lines 21 is at the same level as a layer including the first data lines 13a, so the first transparent conductive lines 21 can be connected directly with the first data lines 13a. For example, the first transparent conductive lines 21 are formed after the first data lines 13a are formed; or the first data lines 13a are formed after the first transparent conductive lines 21 are formed. Particular steps thereof will not be limited thereto.

Alternatively in the embodiment of the disclosure, the first transparent conductive lines 21 are electrically connected with the first data lines 13a through through-holes. As illustrated in FIG. 12B, the first transparent conductive lines 21 are arranged directly in the middle area B1 of the underlying substrate 01, the gate insulation layers 222 and the interlayer medium layers 224 are formed in the first display area A1, and only overlie the first display area A1, and there are only the first transparent conductive lines 21 in the middle area B1; and when the first data lines 13a are formed in the first display area A1, there are also the gate insulation layers 222 and the interlayer medium layers 224 between the first data lines 13a and the first transparent conductive lines 21, so first through-holes 31 running through the gate insulation layers 222 and the interlayer medium layers 224 are formed before the first data lines 13a are formed, and the first data lines 13a are formed so that the first data lines 13a are electrically connected with the first transparent conductive lines 21 through the first through-holes 31.

Alternatively in order to further simplify a process of fabricating the first transparent conductive lines 21, the first transparent conductive lines 21 are arranged at the same layer, at the same time, as the anodes 111 of the OLED light-emitting elements 11 in the embodiment of the disclosure to thereby save the steps and the time for fabricating the first transparent conductive lines 21 separately. As illustrated in FIG. 12C, when the gate insulation layers 222, the interlayer insulation layers 224, and the passivation layers 227, through which light can be transmitted, are formed in the first display area A1, the gate insulation layers 222, the interlayer insulation layers 224, and the passivation layers 227 can overlie the middle area B1, and the anodes 111 are formed so that the first transparent conductive lines 21 overlying the passivation layers 227 are formed in the middle area B1, where the first transparent conductive lines 21 are made of the same material as the anodes 111, which is a transparent electrically-conductive material. Here the first transparent conductive lines 21 are electrically connected with the first data lines 13a through the first through-holes 31 running through the passivation layers 227 and the interlayer insulation layers 224. Here the embodiment of the disclosure will not be limited to any particular layer arranged between the first transparent conductive lines 21 and the underlying substrate 01 in the middle area B1, but only one layer may be arranged, or the same layer, through which light can be transmitted, as the display area may be arranged.

In one embodiment, when the first transparent conductive lines are electrically connected with the first data lines 13a through the first through-holes 31, in order to avoid the middle area B1 from being affected by the arranged first through-holes, and a metal material filled in the first through-holes, the first through-holes 31 are arranged in a non-opening area of the first display area A1, and the first transparent conductive lines 21 are arranged in the first display area A1, so that those segments of the first transparent conductive lines 21, which are connected with the first data lines 13a are arranged in the display area. Furthermore although the thin film transistor structured with a top gate has been illustrated in the embodiment of the disclosure, but the thin film transistor will not be limited thereto, but may alternatively be a thin film transistor structured with a bottom gate, and there may be also other transparent films, for the different types of thin film transistors, in the middle area B1. FIG. 12A, FIG. 12B, and FIG. 12C above merely illustrate the thin film transistor structured with a top gate, but the thin film transistor will not be limited to the structure illustrated in FIG. 12A, FIG. 12B, and FIG. 12C; and for example, there may be also another layer in the middle area B1, so that the first transparent conductive lines 21 can be positioned above or below the other film layer.

Figure 13:
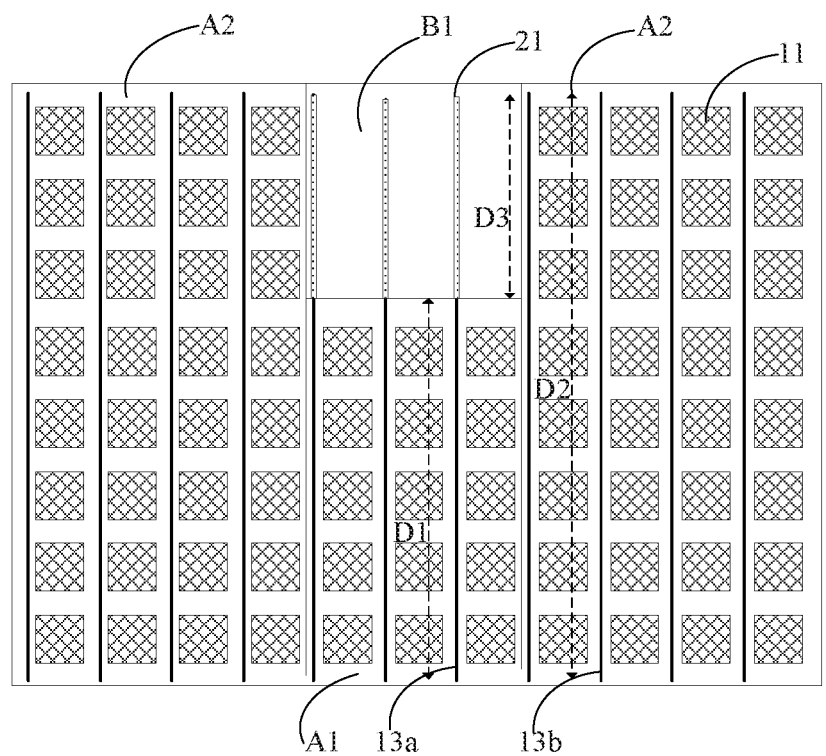
FIG. 13 is a schematic structural diagram of a length relationship between a first transparent conductive line, a first data line, and a data gate line according to an embodiment of the disclosure.

In one embodiment, the wiring length of a second data line 13b in the second display area A2 is larger than the wiring length of a first data line 13a, so there are a larger number of OLED light-emitting elements 11 or pixel circuits connected on the second data line 13b, and thus there is a higher load on the second data line 13b; and for example, while an image is being displayed on the display panel, there are a larger wiring length of the second data line 13b, and a higher load thereon, so a display signal may need to be transmitted to the OLED light-emitting elements 11 connected on the second data line 13b for a larger length of time, and there are a smaller wiring length of the first data line 13a in the first display area A1, and a lower load thereon, so a display signal may need to be transmitted to the OLED light-emitting elements 11 connected on the first data line 13a for a smaller length of time, so that the image being displayed is divided on the screen. Accordingly in the embodiment of the disclosure, after the first transparent conductive lines 21 are arranged in the middle area B1, the first transparent conductive lines 21 are connected with the first data lines 13a, so that the sum of the lengths of a first data line 13a and a first transparent conductive line 21, which are connected with each other is equal to the length of a second data line 13b, thus further alleviating the problem of a signal delay due to the difference in routing length. As illustrated in FIG. 13, the first data lines 13a have a length D1 in the column direction, the second data lines 13b have a length L2 in the column direction, and the first transparent conductive lines 21 have a length L3 in the column direction, so D1, D2, and D3 satisfy the equation of "D1+D3=D2", so that the first data lines 13a connected with the first transparent conductive lines 21 have the same length in the column direction as the length of the second data lines 13b in the column direction, thus avoiding the problem of a signal delay due to the difference in wiring length to thereby improve a display effect of the display panel.

It shall be noted that each of the first display area A1 and the second display area A2 can be controlled using the same integrated circuit element to display an image, or the different display areas can be controlled respectively using different integrated circuit elements to display an image, although the embodiment of the disclosure will not be limited thereto.

In one embodiment, while an image is being displayed, after the first transparent conductive lines 21 are connected with the first data lines 13a, the number of OLED light-emitting elements to which a display signal may need to be transmitted on each second data line 13b is apparently more than the number of OLED light-emitting elements to which a display signal may need to be transmitted on each connected first data line 13a as illustrated in FIG. 13. Accordingly there is a higher load on the second data line 13b than a load on the connected first data line 13a, thus delaying a signal on the second data line 13b. In the embodiment of the disclosure, in order to enable loads on the electrically connected first data lines 13a to be the same as loads on the second data lines 13b, resistances of the first transparent conductive lines 21 can be changed to thereby alleviate the problem of a signal delay. For example, the line widths of the first transparent conductive lines 21 are changed to thereby change the resistances of the first transparent conductive lines 21; or the routing lengths of the first transparent conductive lines 21 are changed to thereby change a length of time for which a signal is transmitted; or the material of the first transparent conductive lines 21 is changed to thereby change the resistances of the first transparent conductive lines 21.

Figure 14A:
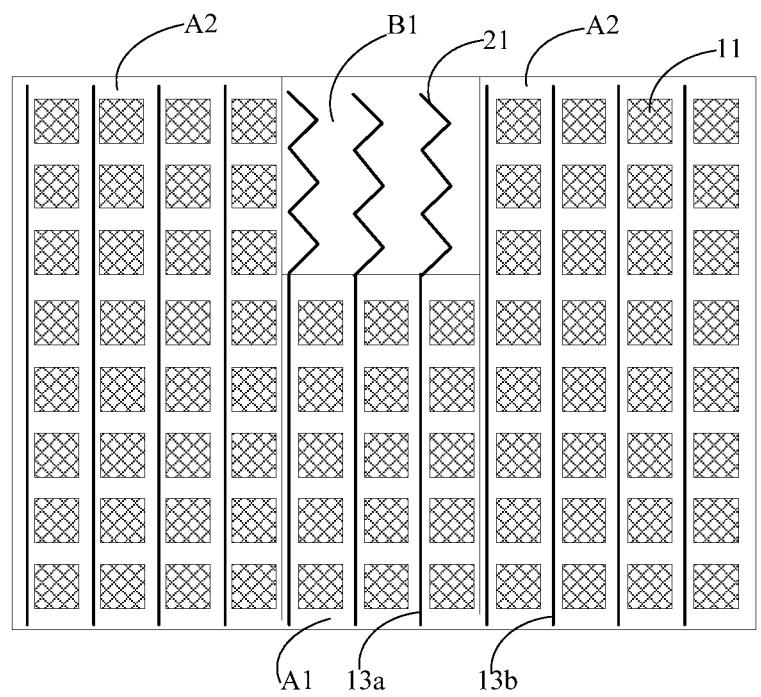
FIG. 14A, FIG. 14B, and FIG. 14C are second schematic structural diagrams respectively of the shape of a first transparent conductive line according to an embodiment of the disclosure.
Figure 14B:
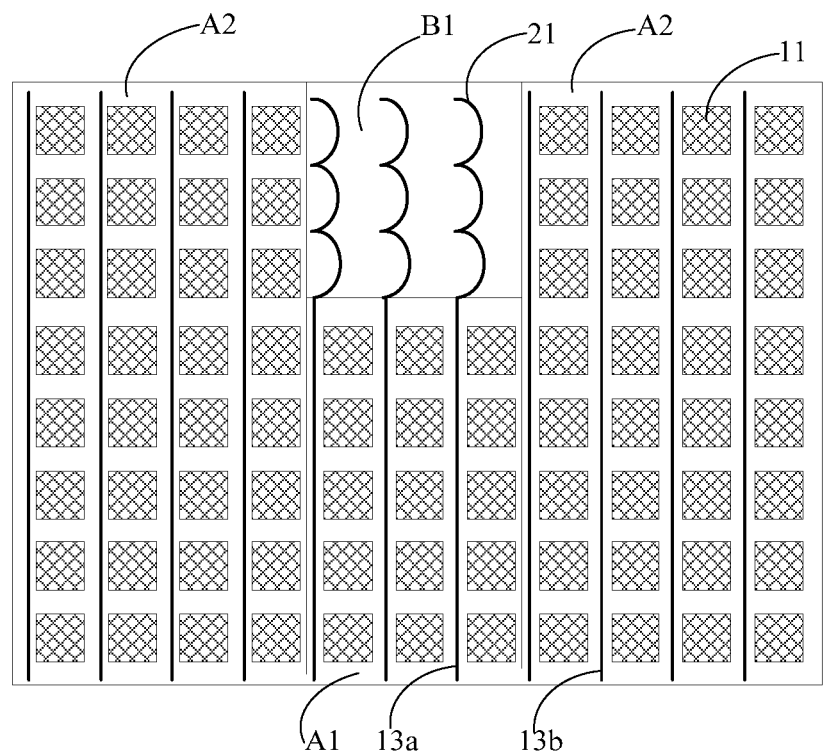
Figure 14C:
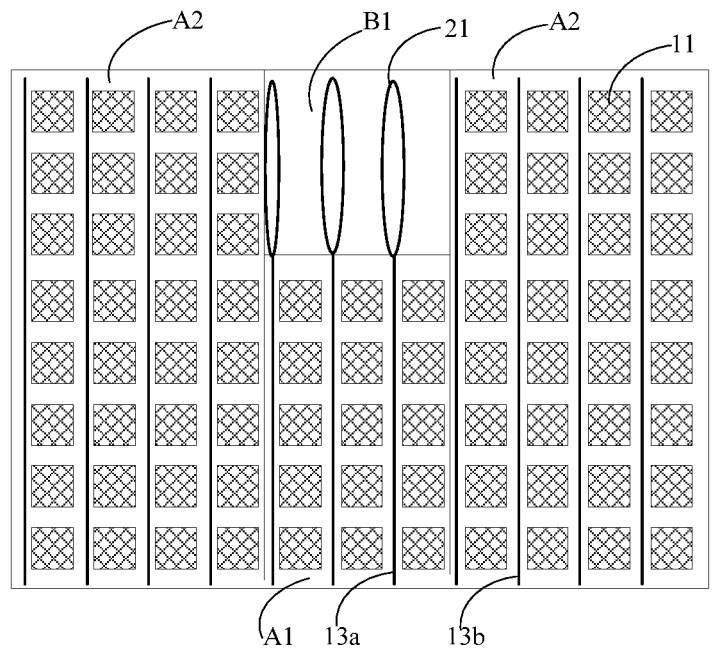

In one embodiment, the routing lengths of the first transparent conductive lines 21 are increased, and as illustrated in FIG. 14A, the first transparent conductive lines 21 are made in a zigzag shape to thereby increase the resistances of the first transparent conductive lines 21 so that there are the same loads on the first data lines 13a electrically connected with the first transparent conductive lines 21 as loads on the second data lines 13b, so there is the same signal delay, and thus a signal is transmitted in the same way, and there is the same image in the first display area A1 and the second display area A2, thus further improving a display effect of the display panel; or as illustrated in FIG. 14B, the first transparent conductive lines 21 are made in a wave shape; or as illustrated in FIG. 14C, the first transparent conductive lines 21 are made in an annular shape, where the first transparent conductive lines 21 are made in an annular shape, so that each first transparent conductive line 21 is electrically connected in two branches with the first data lines 13a to thereby avoid a failure due to the first transparent conductive line 21 being broken, and further increase the resistance of the first transparent conductive line 21.

Figure 15:
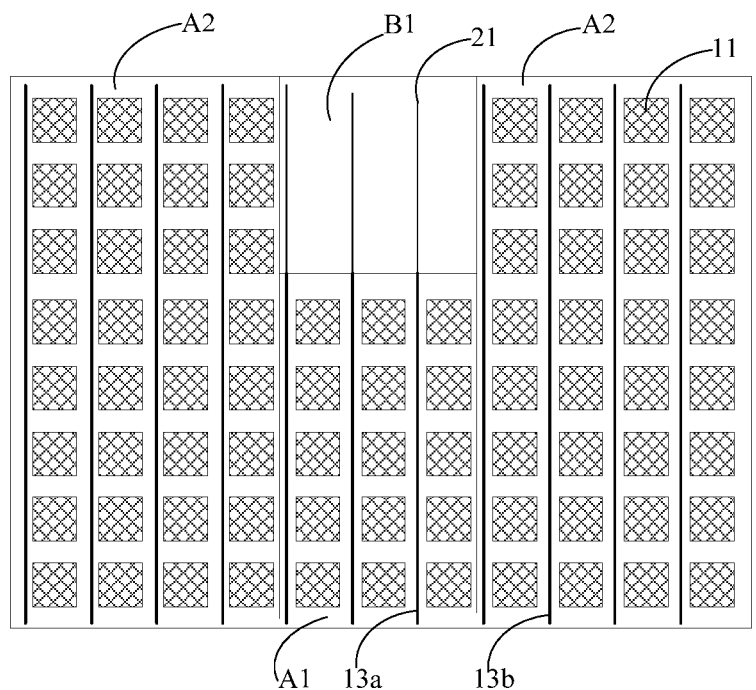
FIG. 15 is a second schematic structural diagram of the line width of a first transparent conductive line according to an embodiment of the disclosure.

In one embodiment, the routing widths of the first transparent conductive lines are changed to thereby increase the resistances of the first transparent conductive lines. As illustrated in FIG. 15, the line widths of the first transparent conductive lines 21 are less than the line widths of the first data lines 13a. In one embodiment, in the embodiment of the disclosure, a line width refers to a routing width, and there are the same line widths of the first data lines 13a as those of the second data lines 13b. Accordingly the routing widths of the first transparent conductive lines 21 are reduced to thereby increase the resistances of the first transparent conductive lines 21, so that there are the same loads on the first data lines 13a electrically connected with the first transparent conductive lines 21 as loads on the second data lines 13b, so there is the same signal delay, and thus there is the same image in the first display area A1 and the second display area A2, thus further improving a display effect of the display panel.

Figure 16:
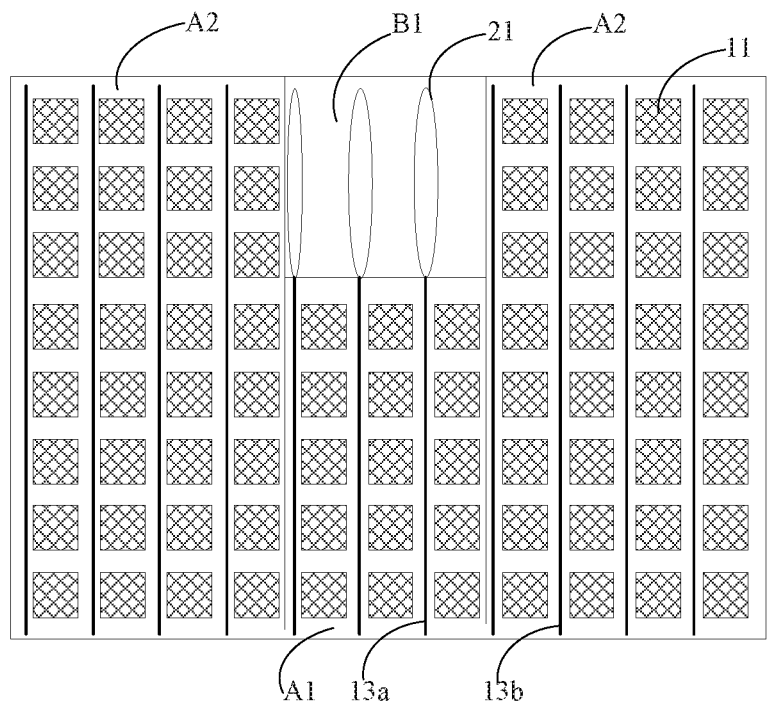
FIG. 16 is a second schematic structural diagram of the line width and the shape of a first transparent conductive line according to an embodiment of the disclosure.

Furthermore in order to enable loads on the second data lines 13b to be the same as loads on the electrically connected first data lines 13a, the lengths of the first transparent conductive lines 21 can be further increased while the line widths of the first transparent conductive lines 21 are reduced, and for example, the first transparent conductive lines 21 are arranged in an annular shape, and the line widths of the first transparent conductive lines 21 are less than the line widths of the first data lines 13a, as illustrated in FIG. 16.

In one embodiment, in the embodiment of the disclosure, the first transparent conductive lines can be formed by designing the resistances of the first transparent conductive lines according to a length of time for which a signal is transmitted on the second data lines 13b while an image is being displayed really on the display panel, so that a length of time, for which a signal is transmitted while the image is being displayed after the first transparent conductive lines are electrically connected with the first data lines 13a, is the same as the length of time for which a signal is transmitted on the second data lines 13a while the image is being displayed, to thereby avoid the image from being displayed poorly and even divided on the screen due to a signal delay.

Figure 17A:
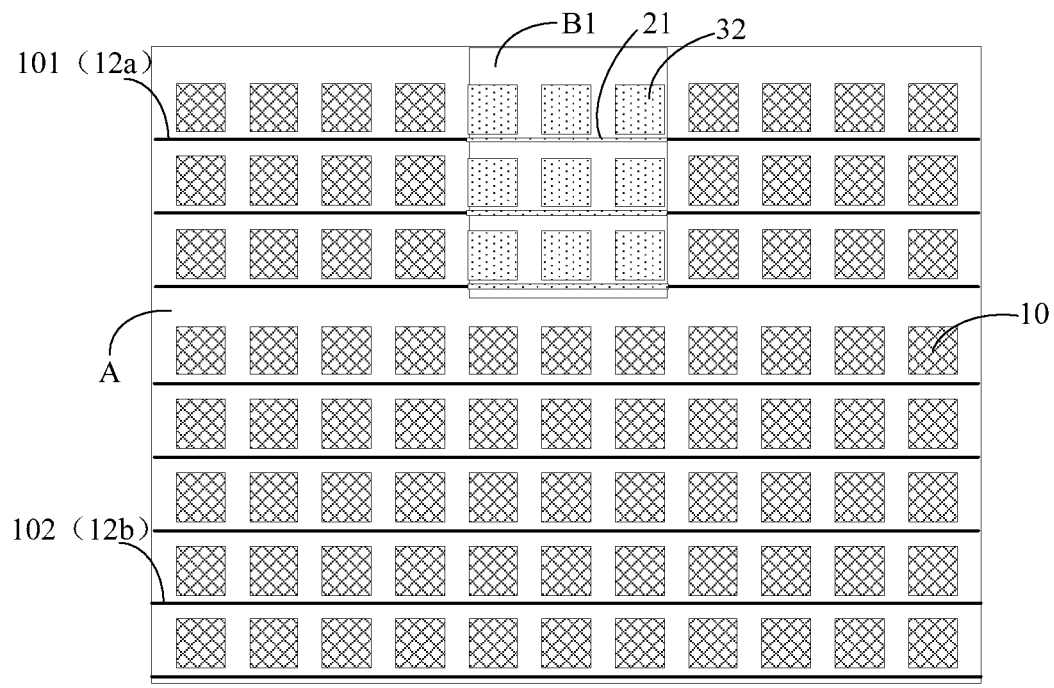
FIG. 17A and FIG. 17B are schematic structural diagrams respectively of a third organic light-emitting display panel according to an embodiment of the disclosure.
Figure 17B:
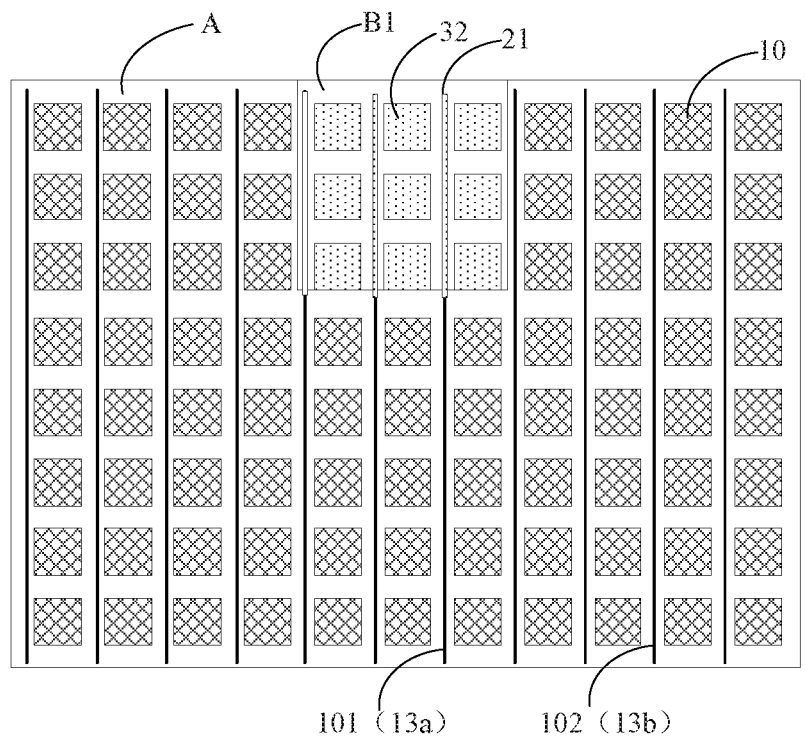

Furthermore in order to avoid a poor display effect in the middle area B1, in the display panel above according to the embodiment of the disclosure, as illustrated in FIG. 17A and FIG. 17B, there are also dummy pixel electrodes 32 arranged between two adjacent first transparent conductive lines 21 in the middle area B1, where the dummy pixel electrodes 32 are arranged in an array, and the sizes of the dummy pixel electrodes 32 may be equal to the sizes of the pixels, thus further avoiding the problem of a poor display effect in the hollowed area of the middle area B1.

Furthermore in order to avoid a fabrication process from being added due to the arrangement of the dummy pixel electrodes 32, the dummy pixel electrodes 32 in the embodiment of the disclosure can be arranged in a layer same as a layer in which the first transparent conductive lines 21 are arranged to thereby dispense with process steps of fabricating the dummy pixel electrodes 32. In one embodiment, the layer of the first transparent conductive lines 21 can be arranged in any one of the structures illustrated in FIG. 7A, FIG. 7B, or FIG. 7C, or the layer of the first transparent conductive lines 21 can be arranged in any one of the structures illustrated in FIG. 12A, FIG. 12B, or FIG. 12C, and the patterns of the first transparent conductive lines 21 can be formed in the middle area B1 by forming the patterns of the dummy pixel electrodes 32, which are arranged at the same layer as, and insulated from the first transparent conductive lines 21, in the middle area B1, where the material of the dummy pixel electrodes 32 is the same as the material of the first transparent conductive lines 21. In one embodiment, both the first transparent conductive lines 21 and the dummy pixel electrodes 32 are fabricated as the anodes of the OLED light-emitting elements to thereby further simplify the process of manufacturing the display panel.

In one embodiment, in the display panel above according to the embodiment of the disclosure, the sum of the number of dummy pixel electrodes 32 corresponding to a first transparent conductive line 21, and the number of pixels 10 corresponding to a first signal line 101 is equal to the number of pixels 10 corresponding to a second signal line 102 as illustrated in FIG. 17A or FIG. 17B. In one embodiment, as illustrated in FIG. 17A, each first transparent conductive line 21 corresponds to three dummy pixel electrodes 32, and there are four pixels 10 corresponding to a first gate line 12a electrically connected with one end of the first transparent conductive line 21, and four pixels 10 corresponding to a first gate line 12a electrically connected with the other end of the first transparent conductive line 21. There are eleven pixels 10 corresponding to each second gate line 12b. Accordingly the sum of the number of dummy pixel electrodes 32 corresponding to the first transparent conductive line 21, and the number of pixels 10 corresponding to the first gate lines 12a electrically connected with the first transparent conductive line 21 is equal to the number of pixels 10 corresponding to the second gate line 12b, so that after each first gate line 12a is electrically connected with the first transparent conductive line 21. there is the same load thereon as a load on the second gate line 12b, thus further guaranteeing a uniform signal for the purpose of displaying an image uniformly. Alternatively as illustrated in FIG. 17B, each first transparent conductive line 21 corresponds to three dummy pixel electrodes 32, and there are live pixels 10 corresponding to a first data line 13a electrically connected with one end of the first transparent conductive line 21. There are eight pixels 10 corresponding to each second data line 13b. Accordingly the sum of the number of dummy pixel electrodes 32 corresponding to the first transparent conductive line 21, and the number of pixels 10 corresponding to the first data line 13a electrically connected with the first transparent conductive line 21 is equal to the number of pixels 10 corresponding to the second data line 13b, so that after each first data line 13a is electrically connected with the first transparent conductive line 21, there is the same load thereon as a load on the second data line 13b, thus further guaranteeing a uniform signal for the purpose of displaying an image uniformly.

It shall be noted that FIG. 17A or FIG. 17B merely illustrates a larger number of pixels corresponding to a second signal line than the number of pixels corresponding to a first signal line, but the embodiment of the disclosure will not be limited to the numbers of pixels illustrated in FIG. 17A or FIG. 17B.

In one embodiment, in the display panel above according to the embodiment of the disclosure, as illustrated in FIG.

Figure 18A:
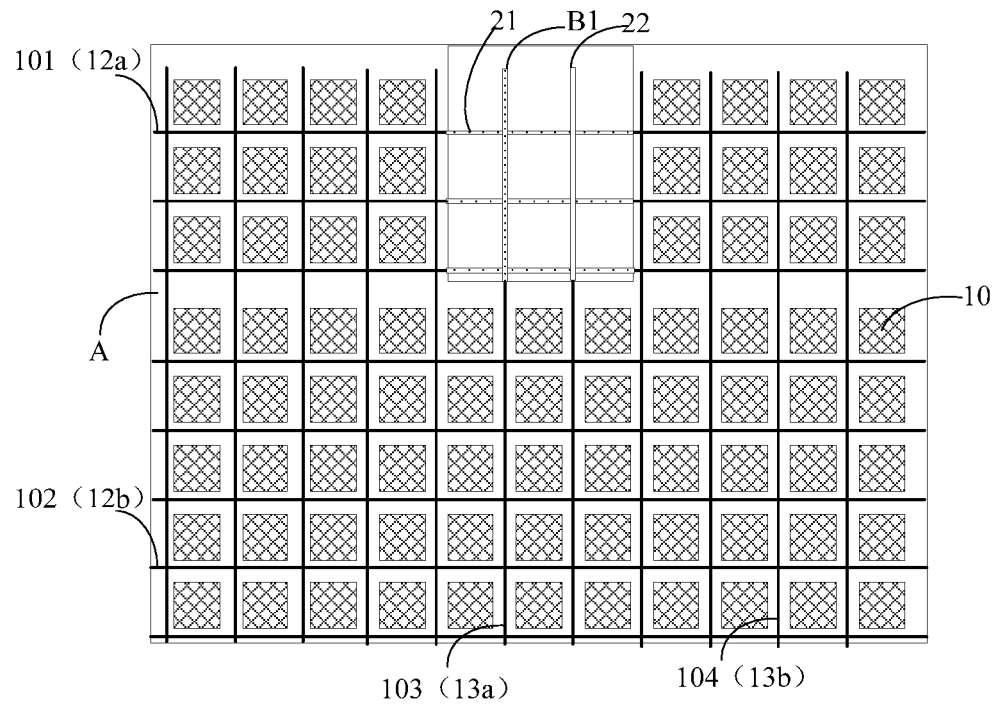
FIG. 18A and FIG. 18B are schematic structural diagrams respectively of a fourth organic light-emitting display panel according to an embodiment of the disclosure.
Figure 18B:
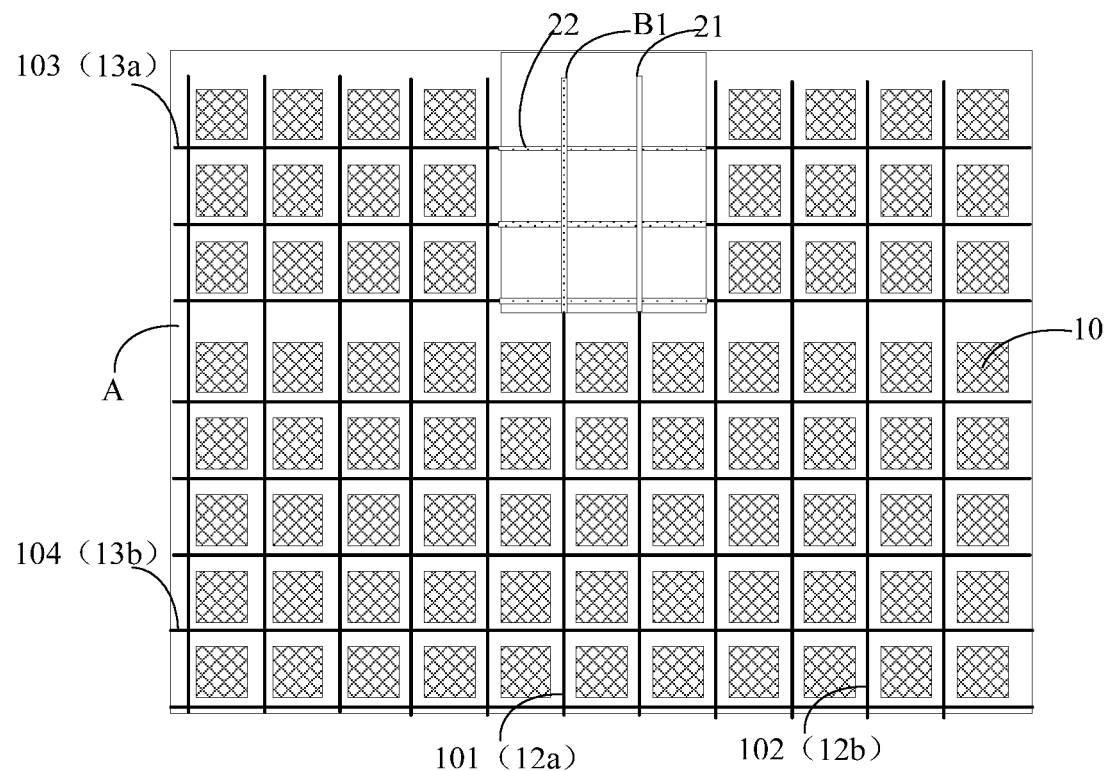

18A or FIG. 18B, there are also third signal lines 103 and fourth signal lines 104, providing signals for the pixels 10, and extending in a second direction, in the display area, where the number of pixels 10 corresponding to a third signal line 103 is less than the number of pixels 10 corresponding to a fourth signal line 104; and there are also second transparent conductive lines 22, electrically connected with the third signal lines 103, and insulated from the first transparent conductive lines 21, in the middle area B1.

In one embodiment, as illustrated in FIG. 18A, the first signal lines 101 and the second signal lines 102 are gate lines respectively, the third signal lines 103 and the fourth signal lines 104 are data lines respectively, and the first direction and the second direction are perpendicular to each other, that is, the first signal lines 101 are first gate lines 12a, the second signal lines 102 are second gate lines 12b, the number of pixels 10 corresponding to a first gate line 12a is less than the number of pixels 10 corresponding to a second gate line 12b, and the first transparent conductive lines 21 are electrically connected with the first gate lines 12a. The third signal lines 103 are first data lines 13a, the fourth signal lines 104 are second data lines 13b, the number of pixels 10 corresponding to a first data line 13a is less than the number of pixels 10 corresponding to a second data line 13b, and the second transparent conductive lines 22 are electrically connected with the first data lines 13a.

Alternatively as illustrated in FIG. 18B, the first signal lines 101 and the second signal lines 102 are data lines respectively, the third signal lines 103 and the fourth signal lines 104 are gate lines respectively, and the first direction and the second direction are perpendicular to each other, that is, the first signal lines 101 are first data lines 13a, the second signal lines 102 are second data lines 13b, the number of pixels 10 corresponding to a first data line 13a is less than the number of pixels 10 corresponding to a second data line 13b, and the first transparent conductive lines 21 are electrically connected with the first data lines 13a. The third signal lines 103 are first gate lines 12a, the fourth signal lines 104 are second gate lines 12b, the number of pixels 10 corresponding to a first gate line 12a is less than the number of pixels 10 corresponding to a second gate line 12b, and the second transparent conductive lines 22 are electrically connected with the first gate lines 12a.

Figure 19:
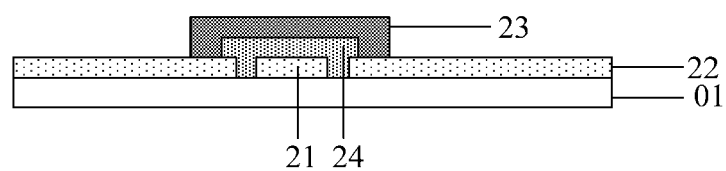
FIG. 19 is a schematic structural diagram of a first transparent conductive line and a second transparent conductive line according to an embodiment of the disclosure.

In one embodiment, in the display panel illustrated in FIG. 18A or FIG. 18B, when the first transparent conductive lines 21 and the second transparent conductive lines 22 are arranged in the middle area B1, in order to avoid the first transparent conductive lines 21 from being electrically connected with the second transparent conductive lines 22, the second transparent conductive lines 22 are electrically connected through metal conductive lines in areas where they intersect with the first transparent conductive lines 21. As illustrated in FIG. 19, the first transparent conductive lines 21 and the second transparent conductive lines 22 in the middle area B1 can be arranged at the same layer, where the second transparent conductive lines 22 are electrically connected through metal conductive lines 21 in the areas where they overlap with the first transparent conductive lines 21, and there are also insulation layers 24 arranged between the first transparent conductive lines 21 and the metal conductive wires 23.

In one embodiment, the second transparent conductive lines are structured the same as the first transparent conductive lines in the embodiment of the disclosure. In one embodiment, the second transparent conductive lines are arranged at the same layer as the first transparent conductive lines, and both the line widths and the routing shapes of the second transparent conductive lines are the same as those of the first transparent conductive lines, although a repeated description thereof will be omitted here.

Figure 20:
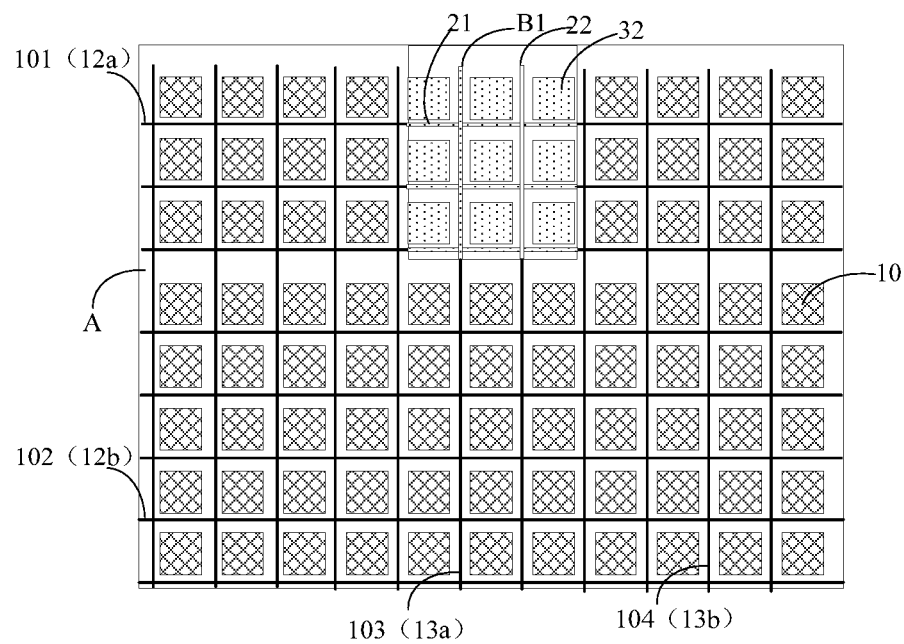
FIG. 20 is a schematic structural diagram respectively of a fifth organic light-emitting display panel according to an embodiment of the disclosure.

In one embodiment, as illustrated in FIG. 20, there are also dummy pixel electrodes 32, arranged in the areas where the first transparent conductive lines 21 intersect with the second transparent conductive lines 22, in the middle area B1 of the display panel, to thereby further improve a display effect of the display panel.

In one embodiment, the dummy pixel electrodes 32 can be arranged in a layer which is the same as a layer in which the first transparent conductive lines 21 and the second transparent conductive lines 22 are arranged, where all of them are arranged as the same layer as the layer in which the anodes of the OLED light-emitting elements are arranged, to thereby further simplify the process of manufacturing the display panel.

In one embodiment, in the display panel above according to the embodiment of the disclosure, the middle area B1 is a non-display area. In one embodiment, the middle area B1 can be arranged as a transparent area in which a camera, an earphone, or another component is arranged, so the middle area B1 is generally arranged as a non-display area, and there are neither OLED light-emitting elements, nor pixel circuits for driving the OLED light-emitting elements to emit light, in the middle area B1. In one embodiment, in the display panel above according to the embodiment of the disclosure, the middle area B1 can alternatively be arranged as a hollow area. In one embodiment, a clock, an alarm icon, or another low-resolution image can be arranged in the middle area B1. As compared with the middle area B1 hollowed, other items can be displayed in effect in the middle area B1.

It shall be noted that the middle area in the embodiment of the disclosure can be arranged at any position on the display panel, the first transparent conductive lines in the display panel can be arranged in different areas of the display panel according to a varying position of the middle area, and when the display panel is divided into a plurality of display areas due to the position of the middle area, an image can be displayed uniformly in the plurality of display areas of the display panel using the first transparent conductive lines arranged in the middle area.

Figure 21:
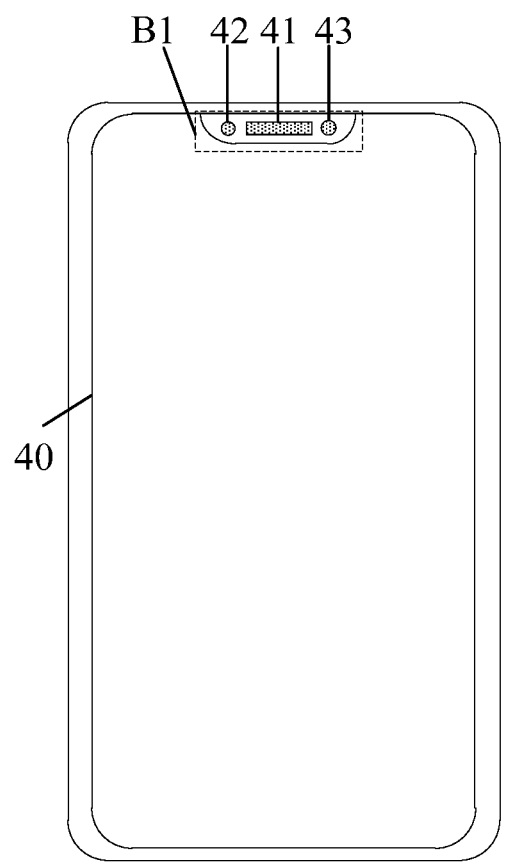
FIG. 21 is a schematic structural diagram respectively of an organic light-emitting display device according to an embodiment of the disclosure.

Based upon the same inventive idea, an embodiment of the disclosure further provides an organic light-emitting display device, which can include the organic light-emitting display panel according to any one of the embodiments above of the disclosure. The display device can be a mobile phone (as illustrated in FIG. 21), a tablet computer, a TV set, a monitor, a notebook computer, a digital photo frame, a navigator, or any other product or component with a display function. Reference can be made to the embodiments of the display panel above for an implementation of the display device, although a repeated description thereof will be omitted here.

In one implementation, in order to provide the display device with a photographing function, in the display device above according to the embodiment of the disclosure, as illustrated in FIG. 21, the display device can further include an image acquirer 41 arranged in the middle area B1 of the display panel 40 (in the dotted box illustrated in FIG. 21), typically on another side than the light exit side of the display panel 40.

In one embodiment, in order to extend application functions of the display device, in the display device above according to the embodiment of the disclosure, the display device can further include one or any combination of an earphone, a light ray sensor, a distance sensor, an iris recognition sensor, and a fingerprint recognition sensor in the middle area B1 of the display panel; and In one embodiment, as illustrated in FIG. 21, 42 or 43 represents any one or combination of an earphone, a light ray sensor, a distance sensor, an iris recognition sensor, and a fingerprint recognition sensor.

A positive projection(s) of the any one or combination of the earphone, the light ray sensor, the distance sensor, the iris recognition sensor, and the fingerprint recognition sensor in the display device respectively onto the display panel lies in a positive projection of the middle area onto the display panel, so that there are more application functions of the display device to extend an application field of the display device.

In summary, in the organic light-emitting display panel according to the embodiments of the disclosure, the organic light-emitting display panel includes a display area and a middle area, and the display panel includes an array substrate, and a plurality of pixels arranged in an array, and first signal lines and second signal lines for providing the pixels with signals and extending in a first direction, in the display area of the array substrate; the number of pixels corresponding to a first signal line is less than the number of pixels corresponding to a second signal line; and there are first transparent conductive lines, electrically connected with the first signal lines, in the middle area. Accordingly the first transparent conductive lines are arranged in the middle area of the display panel according to the embodiments of the disclosure to be electrically connected with the first signal lines to thereby reduce the difference between loads on the first signal lines and the second signal lines so as to reduce the difference between signal delays on the first signal lines and the second signal lines, so that there is a uniform signal on the first signal lines and the second signal lines for the purpose of a uniform image displayed on the display panel so as to avoid the image from being displayed non-uniformly and even divided on the display panel due to the different loads on the signal lines, thus further improving a display effect of the display panel.

The invention claimed is:

1. An organic light-emitting display panel, comprising:
a display area, a middle area of the display panel, an array substrate, a plurality of pixels arranged in an array, and first signal lines and second signal lines configured to provide the pixels with signals and extending in a first direction, in the display area of the array substrate;
wherein a first quantity of the plurality of pixels corresponding to the first signal lines is less than a second quantity of the plurality of pixels corresponding to the second signal lines; and
first transparent conductive lines are electrically connected with the first signal lines in the middle area.

2. The organic light-emitting display panel according to claim 1, wherein the first signal lines are located at either side of the middle area, and the first transparent conductive lines are electrically connected with the first signal lines located at either side of the middle area.

3. The organic light-emitting display panel according to claim 1, wherein the first signal lines are located to one side of the middle area, and the first transparent conductive lines are electrically connected with the first signal lines located to the one side of the middle area.

4. The organic light-emitting display panel according to claim 1, wherein a sum of a length of the first signal lines and a length of the first transparent conductive lines electrically connected with the first signal lines, in the first direction is equal to a length of the second signal lines in the first direction.

5. The organic light-emitting display panel according to claim 1, wherein the first transparent conductive lines are electrically connected with the first signal lines through through-holes; or
the first transparent conductive lines are electrically connected directly with the first signal lines.

6. The organic light-emitting display panel according to claim 5, wherein the through-holes are located in the display area.

7. The organic light-emitting display panel according to claim 1, wherein the first transparent conductive lines are made in one or more of the following: a zigzag, wave, and annular shape.

8. The organic light-emitting display panel according to claim 1, wherein line widths of the first transparent conductive lines are less than line widths of the first signal lines.

9. The organic light-emitting display panel according to claim 1, wherein the array substrate comprises a plurality of light-emitting elements;
each of the light-emitting elements comprises a first electrode, a light-emitting layer, and a second electrode: and
the first transparent conductive lines are arranged at a layer which is same as a layer where the first electrodes are located.

10. The organic light-emitting display panel according to claim 1, wherein a sum of a quantity of pixels corresponding to each of the first transparent conductive lines, and a quantity of pixels corresponding to each of the first signal lines is equal to a quantity of pixels corresponding to each of the second signal lines.

11. The organic light-emitting display panel according to claim 1, further comprising third signal lines and fourth signal lines, providing signals for the pixels, and extending in a second direction, in the display area;
a quantity of pixels corresponding to each of the third signal lines is less than a quantity of pixels corresponding to each of the fourth signal lines; and
further comprising second transparent conductive lines, electrically connected with the third signal lines, and insulated from the first transparent conductive lines in the middle area.

12. The organic light-emitting display panel according to claim 11, wherein the second transparent conductive lines are electrically connected through metal conductive lines in areas where they intersect with the first transparent conductive lines.

13. The organic light-emitting display panel according to claim 11, wherein the second transparent conductive lines are structurally identical to the first transparent conductive lines.

14. The organic light-emitting display panel according to claim 11, wherein the first signal lines are scan signal lines, and the second signal lines are data lines; or the first signal lines are data lines, and the second signal lines are scan signal lines.

15. The organic light-emitting display panel according to claim 11, wherein the first direction is perpendicular to the second direction.

16. The organic light-emitting display panel according to claim 1, wherein the middle area is a non-display area.

17. The organic light-emitting display panel according to claim 1, wherein the middle area is a hollow area.

18. An organic light-emitting display device comprising:
an organic light-emitting display panel, comprising:
a display area, a middle area of the display panel, an array substrate, a plurality of pixels arranged in an array, and first signal lines and second signal lines configured to provide the pixels with signals and extending in a first direction, in the display area of the array substrate;
wherein a first quantity of the plurality of pixels corresponding to the first signal lines is less than a second quantity of the plurality of pixels corresponding to the second signal lines; and
first transparent conductive lines are electrically connected with the first signal lines in the middle area.

19. The display device according to claim 18, wherein the display device further comprises an image acquirer arranged in the middle area of the display panel.

20. The display device according to claim 19, wherein the display device further comprises one or any combination of an earphone, a light ray sensor, a distance sensor, an iris recognition sensor, and a fingerprint recognition sensor; and
a positive projection or projections of the any one or combination of the earphone, the light ray sensor, the distance sensor, the iris recognition sensor, and the fingerprint recognition sensor in the display device respectively onto the display panel lies or lie in a positive projection of the middle area onto the display panel.

\* \* \* \* \*